(12) United States Patent
Miyoshi

(10) Patent No.: US 10,284,935 B2
(45) Date of Patent: May 7, 2019

(54) ELECTROACOUSTIC TRANSDUCER

(71) Applicant: FUJIFILM Corporation, Tokyo (JP)

(72) Inventor: Tetsu Miyoshi, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/701,990

(22) Filed: Sep. 12, 2017

(65) Prior Publication Data

US 2018/0014096 A1 Jan. 11, 2018

Related U.S. Application Data

(63) Continuation of application No. PCT/JP2016/058800, filed on Mar. 18, 2016.

(30) Foreign Application Priority Data

Mar. 27, 2015 (JP) .................................. 2015-066436

(51) Int. Cl.
*H04R 7/24* (2006.01)
*H01L 41/08* (2006.01)
(Continued)

(52) U.S. Cl.
CPC ............... *H04R 1/02* (2013.01); *G10H 3/143* (2013.01); *G10H 3/146* (2013.01);
(Continued)

(58) Field of Classification Search
CPC ... H04R 1/40; H04R 1/02; H04R 1/26; H04R 1/32; H04R 7/24; H04R 17/00; G10H 3/143
See application file for complete search history.

(56) References Cited

U.S. PATENT DOCUMENTS

2014/0210309 A1\* 7/2014 Miyoshi ................... H04R 7/04
310/313 A
2016/0008852 A1 1/2016 Miyoshi
2016/0014527 A1 1/2016 Miyoshi et al.

FOREIGN PATENT DOCUMENTS

JP 10-341498 A 12/1998
JP 2004-297148 A 10/2004
(Continued)

OTHER PUBLICATIONS

Japanese Notification of Reasons for Refusal, dated Aug. 7, 2018, for corresponding Japanese Application No. 2017-509579, with an English Translation.
(Continued)

*Primary Examiner* — Sunita Joshi
(74) *Attorney, Agent, or Firm* — Birch, Stewart, Kolasch & Birch, LLP

(57) ABSTRACT

An omnidirectional electroacoustic transducer capable of reproducing a sound with high acoustic quality and sufficient sound volume in a wide frequency band is provided with a small number of components. The electroacoustic transducer includes: two or more electroacoustic transduction units each including an electroacoustic transduction film and an elastic supporter, the electroacoustic transduction film having a polymer composite piezoelectric body in which piezoelectric body particles are dispersed in a viscoelastic matrix formed of a polymer material having viscoelasticity at a normal temperature, and two thin film electrodes laminated on both surfaces of the polymer composite piezoelectric body, and the elastic supporter being disposed to be closely attached to one principal surface of the electroacoustic transduction film so as to cause the electroacoustic transduction film to be bent, in which the two or more electroacoustic transduction units are disposed so that the
(Continued)

electroacoustic transduction films face outward and form some or all of faces of a polyhedron.

21 Claims, 16 Drawing Sheets

(51) Int. Cl.

| | |
|---|---|
| *H01L 41/09* | (2006.01) |
| *H01L 41/18* | (2006.01) |
| *H04R 17/00* | (2006.01) |
| *H04R 17/02* | (2006.01) |
| *H01L 41/053* | (2006.01) |
| *G10H 3/14* | (2006.01) |
| *H04R 1/02* | (2006.01) |
| *H04R 1/26* | (2006.01) |
| *H04R 1/32* | (2006.01) |
| *H04R 1/40* | (2006.01) |

(52) U.S. Cl.
CPC ...... *H01L 41/0536* (2013.01); *H01L 41/0805* (2013.01); *H01L 41/098* (2013.01); *H01L 41/183* (2013.01); *H04R 1/32* (2013.01); *H04R 7/24* (2013.01); *G10H 2220/535* (2013.01); *G10H 2220/541* (2013.01); *H04R 1/26* (2013.01); *H04R 1/40* (2013.01); *H04R 17/005* (2013.01); *H04R 17/025* (2013.01); *H04R 2307/025* (2013.01); *H04R 2400/01* (2013.01); *H04R 2499/15* (2013.01)

(56) References Cited

FOREIGN PATENT DOCUMENTS

| | | |
|---|---|---|
| JP | 2011-87123 A | 4/2011 |
| JP | 2014-14063 A | 1/2014 |
| WO | WO 2014/157006 A1 | 10/2014 |
| WO | WO 2014/157351 A1 | 10/2014 |

OTHER PUBLICATIONS

Author Unknown, "Technology for Thinning Speaker to About 1/3," Nikkei Technology Online, Retrieved from URL:http://techon.nikkeibp.co.jp/article/FEATURE/20130128/262631/, dated Feb. 21, 2013, with a partial English translation, 3 pages total.

International Search Report and Written Opinion of the International Searching Authority (Forms PCT/ISA/237 and PCT/ISA/210) for International Application No. PCT/JP2016/058800, dated May 31, 2016, with English translations.

Japanese Office Action, dated Nov. 20, 2018, for corresponding Japanese Application No. 2017-509579, with an English translation.

* cited by examiner

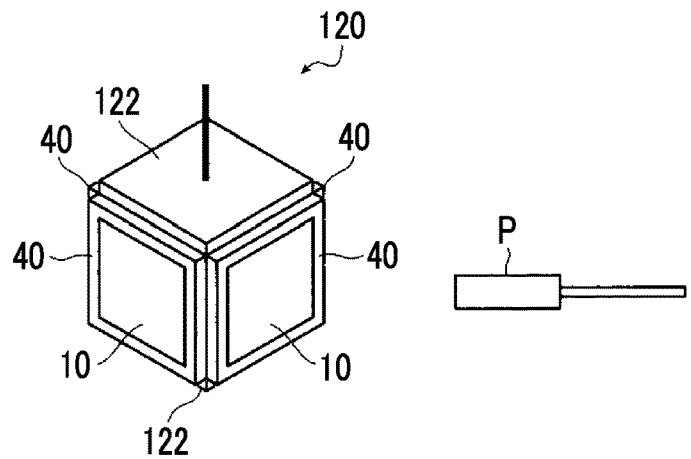
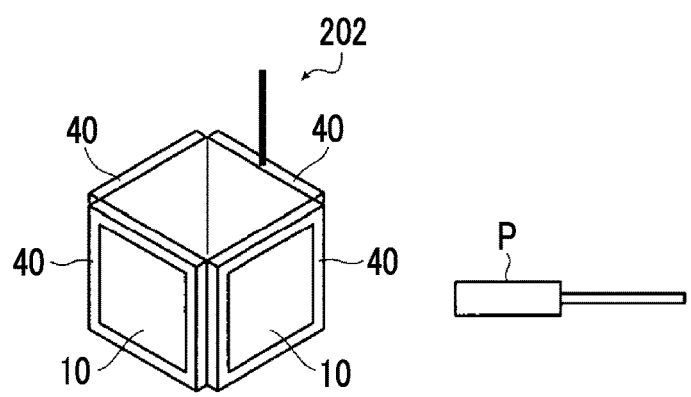
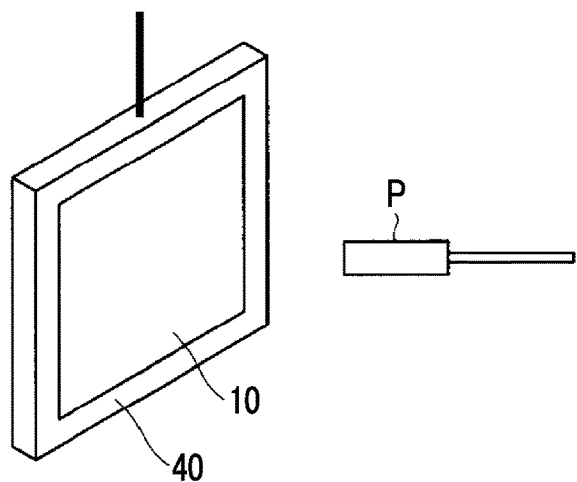

ELECTROACOUSTIC TRANSDUCER

CROSS-REFERENCE TO RELATED APPLICATIONS

This application is a Continuation of PCT International Application No. PCT/JP2016/058800 filed on Mar. 18, 2016, which claims priority under 35 U.S.C. § 119(a) to Japanese Patent Application No. 2015-066436 filed on Mar. 27, 2015. The above application is hereby expressly incorporated by reference, in its entirety, into the present application.

BACKGROUND OF THE INVENTION

1. Field of the Invention

The present invention relates to an electroacoustic transducer used for an acoustic device such as a speaker.

2. Description of the Related Art

Sound has a "property that spreads out" and a "property that goes straight". Sound in a low frequency band (low frequency sound) tends to spread out, and sound in a high frequency band (high frequency sound) tends to go straight. Therefore, in a case of a typical cone speaker, low frequency sound spreads around the speaker, while high frequency sound has a high sound pressure at the front surface of the speaker and has a low sound pressure in the lateral direction or at the rear.

Therefore, in a speaker having different directivities between frequency bands as described above, the balance of frequencies on the axis (immediately in front of) of the speaker and off the axis varies and the tone also varies, resulting in a decrease in acoustic quality.

Here, as a configuration that realizes an omnidirectional speaker capable of allowing a sound from the speaker to spread 360 degrees around the speaker and thus reproducing a sound with high acoustic quality at any position without variation in the balance of frequencies with a listening position, a configuration in which speaker units are disposed back to back or a configuration in which a number of speaker units are radially attached is considered.

However, as described in "technology for thinning speaker to about ⅓" (URL: http://techon.nikkeibp.co.jp/article/FEATURE/20130128/262631/) in Nikkei Technology Online, even though speaker units are configured to be disposed back to back using a cone speaker in the related art, the sound pressure level of a high frequency band in the horizontal direction decreases, and furthermore, the frequency properties at the front surface or in an inclined direction are disturbed. This is because due to the distance between the two speaker units separated from each other, the arrival time of sound from each of the speaker units at a listener (microphone) differs and a phase shift occurs. In addition, even though a number of cone speakers are configured to be radially attached, due to the distance difference between the vibration plates of the speaker units, the arrival time (phase) of sound from each of the speaker units differs, and the frequency properties are disturbed. Accordingly, the balance of frequencies varies with a listening position and the tone also varies.

In addition, in a case of the cone speaker, in order to reproduce a low band, a certain volume is required for an enclosure. However, when a number of speaker units are used, the space is taken by the magnetic circuit to that extent, and thus the substantive volume of the enclosure is insufficient, resulting in a difficulty in reproducing a low band. On the other hand, when the enclosure is increased in size in order to ensure the volume of the enclosure, the distance between the vibration plate further increases, and the disturbance of the frequency properties further increases.

As described above, in the case of using the cone speaker in the related art, since the arrival time of sound waves differs due to the distance difference between the vibration plates, the balance of frequencies varies with a listening position and the tone also varies.

Contrary to this, in "technology for thinning speaker to about ⅓" (URL: http://techon.nikkeibp.co.jp/article/FEATURE/20130128/262631/) in Nikkei Technology Online, a configuration in which HVT (Horizontal-Vertical Transforming) speakers which are thin speakers are disposed back to back is disclosed. It is described that by using the thin speakers, the distance difference between the vibration plates can be reduced, the volume of the enclosure can be ensured, and thus an omnidirectional speaker with high acoustic quality is obtained.

An HVT speaker has a configuration in which a driving source (a magnet or voice coil) is disposed at the side surface of a vibration plate and amplifies the vibration plate via a linkage mechanism. With this configuration, a sufficient clearance can be ensured for both the driving source and the vibration plate in the amplitude direction, and thus a speaker unit with reduced thickness and lower lowest resonance frequencies can be achieved.

It is described that by disposing two such thin speakers back to back, the distance between the two vibration plates can be reduced, there is substantially no difference in the arrival time of sound from each of the vibration plates at a listener, and thus design of a speaker having an omnidirectional radial pattern is facilitated.

SUMMARY OF THE INVENTION

However, the HVT speaker has a problem that the sound pressure levels of an intermediate frequency band (intermediate band) and a high frequency band (high band) are lower than that of a low frequency band (low band). In addition, since the vibration plate is driven via the linkage mechanism between the driving source and the vibration plate, there are problems that the number of components is very large, the productivity is low, and the manufacturing cost is high.

An object of the present invention is to solve such a problem of the related art, and is to provide an omnidirectional electroacoustic transducer capable of reproducing a sound with high acoustic quality and sufficient sound volume in a wide frequency band, with a small number of components.

The present inventors have intensively studied to attain the object, and found that by causing an electroacoustic transducer to include: an electroacoustic transduction film including a polymer composite piezoelectric body in which piezoelectric body particles are dispersed in a viscoelastic matrix formed of a polymer material having viscoelasticity at a normal temperature, and two thin film electrodes laminated on both surfaces of the polymer composite piezoelectric body; and two or more electroacoustic transduction units each having an elastic supporter which is disposed to be closely attached to one principal surface of the electroacoustic transduction film so as to cause the electroacoustic transduction film to be bent, and by disposing the two or more electroacoustic transduction units so that the electroacoustic transduction films face outward and form some or all of faces of a polyhedron, an omnidirectional electroacoustic transducer capable of reproducing a sound with high acoustic quality and sufficient sound volume in a wide frequency band can be realized with a small number of components, thereby completing the present invention.

That is, the present invention provides an electroacoustic transducer having the following configuration.

(1) An electroacoustic transducer comprising: two or more electroacoustic transduction units each including an electroacoustic transduction film and an elastic supporter, the electroacoustic transduction film having a polymer composite piezoelectric body in which piezoelectric body particles are dispersed in a viscoelastic matrix formed of a polymer material having viscoelasticity at a normal temperature, and two thin film electrodes laminated on both surfaces of the polymer composite piezoelectric body, and the elastic supporter being disposed to be closely attached to one principal surface of the electroacoustic transduction film so as to cause the electroacoustic transduction film to be bent, in which the two or more electroacoustic transduction units are disposed so that the electroacoustic transduction films face outward and form some or all of faces of a polyhedron.

(2) The electroacoustic transducer according to (1), in which the elastic supporter is a viscoelastic supporter having viscoelasticity.

(3) The electroacoustic transducer according to (1) or (2), in which a bent portion of the electroacoustic transduction film gradually changes in curvature from a center to a peripheral portion.

(4) The electroacoustic transducer according to any one of (1) to (3), in which the polyhedron belongs to any one of a regular polyhedron, a semiregular polyhedron, and a quasi-regular polyhedron.

(5) The electroacoustic transducer according to any one of (1) to (4), in which a shape of the bent portion of the electroacoustic transduction film, when viewed in a direction perpendicular to the principal surface of the electroacoustic transduction film, is a regular polygonal shape.

(6) The electroacoustic transducer according to any one of (1) to (5), in which cone speaker units are provided in some of the faces of the polyhedron with radiation surfaces facing outward.

(7) The electroacoustic transducer according to any one of (1) to (6), in which a storage elastic modulus (E') of the electroacoustic transduction film at a frequency of 1 Hz according to dynamic viscoelasticity measurement is 10 to 30 GPa at 0° C. and 1 to 10 GPa at 50° C.

(8) The electroacoustic transducer according to any one of (1) to (7), in which a glass transition temperature of the polymer material at a frequency of 1 Hz is 0° C. to 50° C.

(9) The electroacoustic transducer according to any one of claims 1 to 8, wherein, in the polymer material, a local maximum value at which a loss tangent Tan δ at a frequency of 1 Hz according to the dynamic viscoelasticity measurement is greater than or equal to 0.5 is present in a temperature range of 0° C. to 50° C.

(10) The electroacoustic transducer according to any one of (1) to (9), in which the polymer material has a cyanoethyl group.

(11) The electroacoustic transducer according to any one of (1) to (10), in which the polymer material is cyanoethylated polyvinyl alcohol.

According to the electroacoustic transducer of the present invention, it is possible to provide an omnidirectional electroacoustic transducer capable of reproducing a sound with high acoustic quality and sufficient sound volume in a wide frequency band, with a small number of components.

BRIEF DESCRIPTION OF THE DRAWINGS

FIG. 7A is a perspective view conceptually illustrating another example of the electroacoustic transducer of the present invention used for sound pressure level measurement.

FIG. 7B is a perspective view conceptually illustrating an electroacoustic transducer of a reference example used for sound pressure level measurement.

FIG. 8 is a perspective view conceptually illustrating an electroacoustic transducer used for sound pressure level measurement.

DESCRIPTION OF THE PREFERRED EMBODIMENTS

Hereinafter, an electroacoustic transducer of the present invention will be described in detail based on the preferred embodiments shown in the accompanying drawings.

Descriptions of the constituent elements described below may be made based on representative embodiments of the present invention, but the present invention is not limited to the embodiments.

In this specification, a numerical range expressed by using "to" means a range including numerical values described before and after "to" as a lower limit and an upper limit.

Figure 1A:
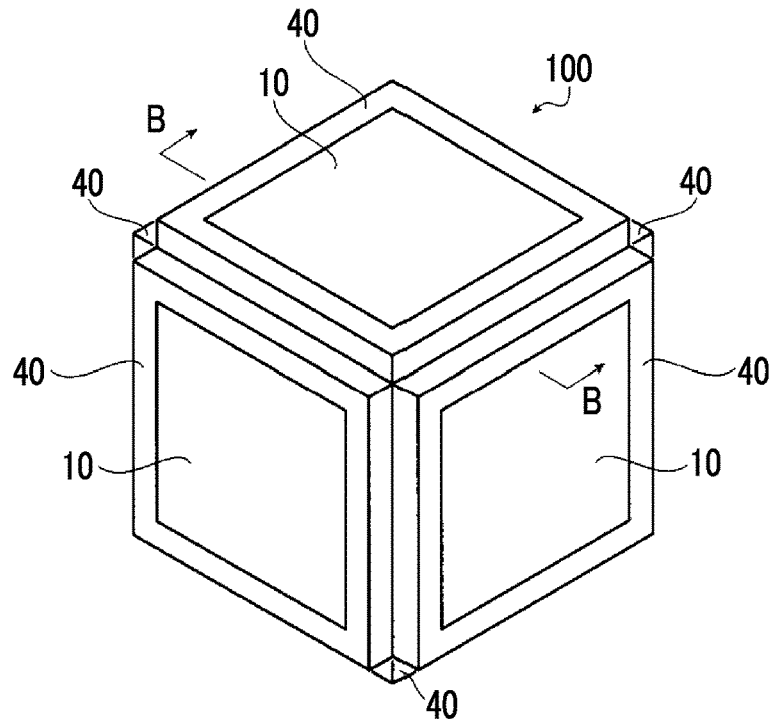
FIG. 1A is a perspective view schematically illustrating an example of an electroacoustic transducer of the present invention.
Figure 1B:
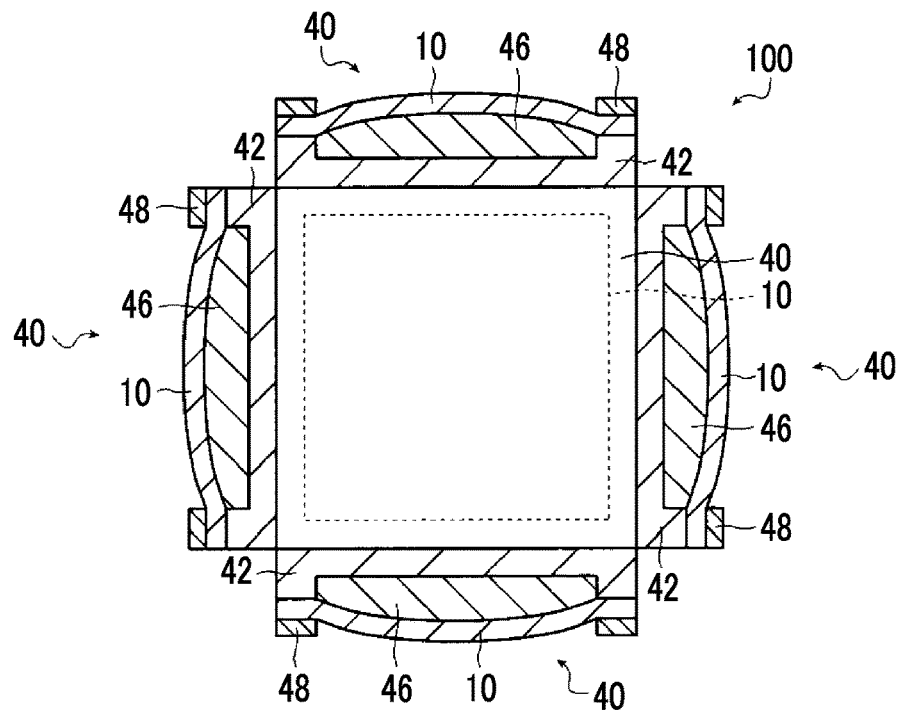
FIG. 1B is a sectional view taken along line B-B of FIG. 1A.

FIG. 1A is a perspective view schematically illustrating an example of an electroacoustic transducer of the present invention, and FIG. 1B is a sectional view taken along line B-B of FIG. 1A.

As illustrated in FIGS. 1A and 1B, an electroacoustic transducer 100 includes six electroacoustic transduction units 40, and the six electroacoustic transduction units 40 are disposed to form a regular hexahedron (cube) in which the surfaces on electroacoustic transduction film 10 side face outward.

Therefore, in the electroacoustic transduction units 40 constituting the electroacoustic transducer 100 in the illustrated example, the shape of the surface on the electroacoustic transduction film side is a regular quadrilateral shape (square shape).

The electroacoustic transducer 100 is used as various acoustic devices such as a speaker, a microphone, and a pickup used in musical instruments including a guitar, and is used for generating, when an electrical signal is input to the transduction film 10, a sound due to a vibration according to the electrical signal or for converting the vibration of the transduction film 10 generated by receiving the vibration of the air into an electrical signal.

First, the electroacoustic transduction unit 40 will be described with reference to FIGS. 2A and 2B.

Figure 2A:
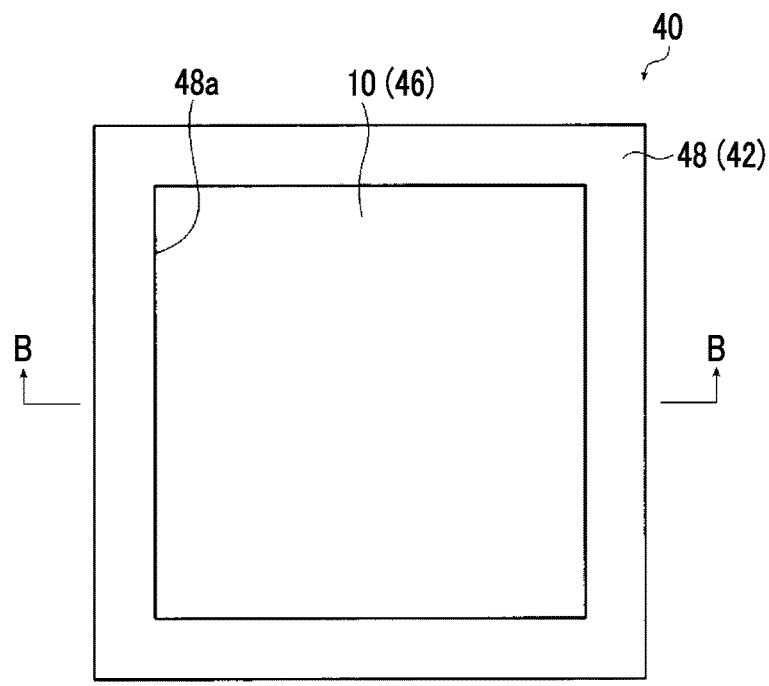
FIG. 2A is a front view schematically illustrating one of electroacoustic transduction units constituting the electroacoustic transducer of the present invention.
Figure 2B:
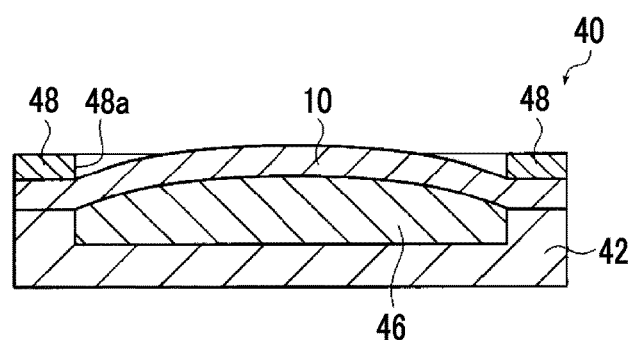
FIG. 2B is a sectional view taken along line B-B of FIG. 2A.

FIG. 2A is a front view schematically illustrating the electroacoustic transduction unit 40, and FIG. 2B is a sectional view taken along line B-B of FIG. 2A.

The electroacoustic transduction unit 40 uses the electroacoustic transduction film (hereinafter, also referred to as "transduction film") 10 as a vibration plate.

In the electroacoustic transduction unit 40, when the transduction film 10 is stretched in an in-plane direction due to the application of a voltage to the transduction film 10, the transduction film 10 moves upward (in the radial direction of sound) in order to absorb the stretching. Conversely, when the transduction film 10 is contracted in the in-plane direction due to application of a voltage to the transduction film 10, the transduction film 10 moves downward (toward a case 42) in order to absorb the contraction. The electroacoustic transduction unit 40 performs a conversion between a vibration (sound) and an electrical signal by the vibrations caused by repetition of stretching and contraction of the transduction film 10.

The electroacoustic transduction unit 40 is configured to include the transduction film 10, the case 42, a viscoelastic supporter 46, and a pressing member 48.

The transduction film 10 is a piezoelectric film which has piezoelectric properties so as to cause the principal surfaces thereof to stretch and contract in response to the state of an electric field, and converts a stretching and contracting movement along a film surface into a vibration in a direction perpendicular to the film surface by being held in a bent state, thereby converting an electrical signal into a sound.

Here, the transduction film 10 used in the electroacoustic transduction unit 40 of the present invention is a transduction film including a polymer composite piezoelectric body in which piezoelectric body particles are dispersed in a viscoelastic matrix formed of a polymer material having viscoelasticity at a normal temperature, and two thin film electrodes laminated on both surfaces of the polymer composite piezoelectric body.

The transduction film 10 will be described later in detail.

The case 42 is a holding member that holds the transduction film 10 and the viscoelastic supporter 46 together with the pressing member 48, and is a box-shaped case which is formed of plastic, metal, wood, or the like and has an open surface. As illustrated in the figure, the case 42 has a thin hexahedral shape, and one of the largest surfaces is the open surface. The open portion has a regular quadrilateral shape. The 42 accommodates the viscoelastic supporter 46 therein.

The viscoelastic supporter 46 has moderate viscosity and elasticity, holds the transduction film 10 in a bent state, and imparts a constant mechanical bias at any place of the transduction film 10 to efficiently convert the stretching and contracting movement of the transduction film 10 into a forward and rearward movement (a movement in the direction perpendicular to the surface of the transduction film).

In the illustrated example, the viscoelastic supporter 46 has a quadrangular prism shape having a bottom surface shape substantially equal to the bottom surface of the case 42. In addition, the height of the viscoelastic supporter 46 is larger than the depth of the case 42.

The material of the viscoelastic supporter 46 is not particularly limited as long as the material has moderate viscosity and elasticity and suitably deforms without impeding the vibration of the piezoelectric film. As an example, wool felt, nonwoven fabric of wool felt including rayon or PET, a foamed material (foamed plastic) such as glass wool or polyurethane, polyester wool, a laminate of a plurality of sheets of paper, a magnetic fluid, a coating material, and the like are exemplified.

The specific gravity of the viscoelastic supporter 46 is not particularly limited and may be appropriately selected according to the type of the viscoelastic supporter. As an example, in a case where felt is used as the viscoelastic supporter, the specific gravity thereof is preferably 50 to 500 kg/m$^3$, and more preferably 100 to 300 kg/m$^3$. In a case where glass wool is used as the viscoelastic supporter, the specific gravity thereof is preferably 10 to 100 kg/m$^3$.

The pressing member 48 is for supporting the transduction film 10 in a state of being pressed against the viscoelastic supporter 46, and is a member formed of plastic, metal, wood, or the like in a regular quadrilateral shape with an opening 48a at the center. The pressing member 48 has the same shape as the open surface of the case 42, and the shape of the opening 48a is the same regular quadrilateral shape as the open portion of the case 42.

The electroacoustic transduction unit 40 is configured by accommodating the viscoelastic supporter 46 in the case 42, covering the case 42 and the viscoelastic supporter 46 with the transduction film 10, and fixing the pressing member 48 to the case 42 in a state in which the periphery of the transduction film 10 is brought into contact with the open surface of the case 42 by the pressing member 48.

A method of fixing the pressing member 48 to the case 42 is not particularly limited, and various known methods such as a method using screws, bolts and nuts and a method using a fixing jig are able to be used.

In the electroacoustic transduction unit 40, the height (thickness) of the viscoelastic supporter 46 is greater than the height of the inner surface of the case 42. That is, in a state before the transduction film 10 and the pressing member 48 are fixed, the viscoelastic supporter 46 is in a state protruding from the upper surface of the case 42.

Therefore, in the electroacoustic transduction unit 40, the viscoelastic supporter 46 is held in a state in which the viscoelastic supporter 46 is pressed downward by the transduction film 10 and decreases in thickness toward the peripheral portion of the viscoelastic supporter 46. That is, at least a portion of the principal surface of the transduction film 10 is held in a bent state. Accordingly, a bent portion is formed in at least a portion of the transduction film 10. In the electroacoustic transduction unit 40, the bent portion serves as a vibration surface. In the following description, the bent portion is also referred to as a vibration surface.

At this time, it is preferable that the entire surface of the viscoelastic supporter 46 is pressed in the surface direction of the transduction film 10 so that the thickness decreases over the entire surface. That is, it is preferable that the entire surface of the transduction film 10 is pressed and supported by the viscoelastic supporter 46.

In addition, it is preferable that the bent portion formed in this way gradually changes in curvature from the center to the peripheral portion. Accordingly, the resonance frequencies are distributed, resulting in a wider band.

In addition, in the electroacoustic transduction unit 40, the viscoelastic supporter 46 is in a state of being compressed more in the thickness direction as it approaches the pressing member 48. However, due to the static viscoelastic effect (stress relaxation), a constant mechanical bias can be maintained at any place of the transduction film 10. Accordingly, the stretching and contracting movement of the transduction film 10 is efficiently converted into a forward and rearward movement, so that it is possible to obtain a flat electroacoustic transduction unit 40 that is thin, achieves a sufficient sound volume, and has excellent acoustic properties.

In the electroacoustic transduction unit 40 having such a configuration, a region of the transduction film 10 corresponding to the opening 48a of the pressing member 48 serves as the bent portion that actually vibrates. That is, the pressing member 48 is a portion that defines the bent portion.

The size of the bent portion of the electroacoustic transduction unit 40 with respect to the surface of the electroacoustic transduction unit 40 on the transduction film 10 side is not particularly limited, and is preferably more than or equal to 80%, and more preferably 90% to 98%. In an electroacoustic transduction unit which uses a transduction film having piezoelectric properties, it is easy to increase the relative size of a vibration plate to the entire unit compared to a cone speaker generally having a circular vibration plate, and for example, in a case where a plurality of electroacoustic transduction units having a regular polygonal shape are disposed close to each other to constitute a polyhedron, the interval between the adjacent vibration plates can be made very small, and thus the radiation impedance significantly increases. Therefore, in a band of particularly low frequencies (low band), the sound pressure amplification effect more than the number of units can be expected. At this time, it is important for the polyhedron to have a sealed structure in order to block the escape passage of air.

From the above viewpoint, the width of the edge portion of the pressing member 48 is preferably less than or equal to 20 mm, and preferably 1 mm to 10 mm.

Furthermore, it is preferable that the surface of the electroacoustic transduction unit 40 on the transduction film 10 side and the bent portion are similar. That is, it is preferable that the outer shape of the pressing member 48 and the shape of the opening 48a are similar.

In addition, in the electroacoustic transduction unit 40, the pressing force of the viscoelastic supporter 46 against the transduction film 10 is not particularly limited, and is 0.005 to 1.0 MPa and particularly preferably about 0.02 to 0.2 MPa at a position where the surface pressure is low.

The height difference of the transduction film 10 assembled into the electroacoustic transduction unit 40, that is, in the illustrated example, the distance between the point nearest to the bottom surface of the pressing member 48 and the point furthest therefrom is not particularly limited, and is 1 to 50 mm and particularly preferably about 5 to 20 mm from a viewpoint of allowing the transduction film 10 to sufficiently perform an upward and downward movement.

Moreover, although the thickness of the viscoelastic supporter 46 is not particularly limited, the thickness thereof before being pressed is 1 to 100 mm, and particularly preferably 10 to 50 mm.

In the illustrated example, the configuration in which the viscoelastic supporter 46 having viscoelasticity is used is provided, but is not limited thereto, and a configuration using an elastic supporter having at least elasticity may be provided.

For example, a configuration including an elastic supporter having elasticity instead of the viscoelastic supporter 46 may be provided.

As the elastic supporter, natural rubber and various synthetic rubbers are exemplified.

An O-ring or the like may be interposed between the case 42 and the transduction film 10. With this configuration, a damper effect is able to be achieved, and it is possible to prevent the vibration of the transduction film 10 from being transmitted to the case 42, and to obtain excellent acoustic properties.

The transduction film 10 itself may be molded in advance into a convex shape or a concave shape. In that time, the entirety of the transduction film 10 may be molded into a convex shape or a concave shape, or a portion of the transduction film may be molded into a convex portion (concave portion). A forming method of the convex portion is not particularly limited, and various known processing methods of resin films are able to be used. For example, the convex portion is able to be formed by a vacuum pressure molding method or a forming method such as embossing.

In the example illustrated in FIGS. 2A and 2B, the configuration in which the transduction film 10 is pressed against the viscoelastic supporter 46 so as to be supported using the pressing member 48 is provided, but is not limited thereto. For example, a configuration in which the end portion of the transduction film is fixed to the rear surface side of the case 42 using the transduction film 10 which is larger than the open surface of the case 42 may be provided. That is, the case 42 and the viscoelastic supporter 46 disposed in the case 42 may be covered with the transduction film 10 which is larger than the open surface of the case 42, the end portion of the transduction film 10 may be pulled toward the rear surface side of the case 42 so the transduction film 10 is pressed against the viscoelastic supporter 46 to be bent with a tension, and the end portion of the transduction film may be fixed to the rear surface side of the case 42.

Next, the electroacoustic transducer 100 will be described.

The electroacoustic transducer 100 illustrated in FIGS. 1A and 1B has six electroacoustic transduction units (hereinafter, also referred to as "transduction units") 40 described above, which are disposed to form a regular hexahedron (cube) in which the surface of each of the six transduction units 40 on transduction film 10 side faces outward.

Specifically, as illustrated in the figure, in the electroacoustic transducer 100, the six transduction units 40 have the same shape and size, and the transduction units 40 are disposed so that each side of the surface of one transduction unit 40 on the transduction film 10 side is aligned with one side of another transduction unit 40 and the angle between the surfaces thereof on the transduction film 10 side is 90°.

In the following description, the shape of the transduction unit is the shape of the surface of the transduction unit on the transduction film side.

A method of fixing the transduction units 40 together is not particularly limited, and various known methods such as a method using screws, bolts and nuts and a method using a fixing jig are able to be used.

As described above, hitherto, as an omnidirectional electroacoustic transducer, a configuration is proposed in which HVT (Horizontal-Vertical Transforming) speakers which are thin speakers are disposed back to back.

This HVT speaker has a configuration in which a driving source (a magnet or voice coil) is disposed at the side surface of a vibration plate and amplifies the vibration plate via a linkage mechanism. With this configuration, a sufficient clearance can be ensured for both the driving source and the vibration plate in the amplitude direction, and thus a reduction in thickness can be achieved.

By disposing two such thin speakers back to back, the distance between the two vibration plates can be reduced, and there is substantially no difference in the arrival time of sound from each of the vibration plates at a listener. Therefore, design of a speaker having an omnidirectional radial pattern is facilitated.

However, the HVT speaker has a problem that the sound pressure levels of an intermediate band a high band are lower than that of a low band. In addition, since the vibration plate is driven via the linkage mechanism between the driving source and the vibration plate, there are problems that the number of components is very large, the productivity is low, and the manufacturing cost is high.

Contrary to this, in the present invention, an electroacoustic transduction film including a polymer composite piezoelectric body in which piezoelectric body particles are dispersed in a viscoelastic matrix formed of a polymer material having viscoelasticity at a normal temperature and two thin film electrodes laminated on both surfaces of the polymer composite piezoelectric body, and a plurality of electroacoustic transduction units each having an elastic supporter which is disposed to be closely attached to one principal surface of the electroacoustic transduction film so as to cause the electroacoustic transduction film to be bent are provided, and the electroacoustic transduction films of the plurality of electroacoustic transduction units face outward and form some or all of faces of a polyhedron.

In the electroacoustic transducer of the present invention, the electroacoustic transduction units are disposed close to each other to form the polyhedron as described above. Therefore, the radiation impedance significantly increases, and in a band of particularly low frequencies (low band), the sound pressure amplification effect more than the number of units can be obtained.

Here, the radiation impedance Z is an impedance that takes the speed V (=the displacement speed of the surface of the vibration plate) of the vibration plate as an input and the reaction force F generated by the vibration plate pressing a gas as an output. That is, the radiation impedance Z is an amount defined by $F=Z \times V$. This is an amount representing the efficiency of conversion from a mechanical vibration to a sound wave and is an important value in discussing the characteristics of speakers. The radiation impedance is an amount obtained by multiplying the sound pressure on the surface of the vibration plate by the surface area. In the electroacoustic transducer of the present invention, since the area of the electroacoustic transduction unit and the area of the vibration plate (bent portion) can be made substantially the same, the interval between adjacent vibration plates is very narrow and a seamless sound field can be formed. Therefore, compared to a case where a plurality of cone speakers of the related art are disposed, the radiation impedance can be effectively increased. Furthermore, since the difference in the arrival time of sound waves due to the distance difference between the vibration plate is less likely occur, more suitable omnidirectionality is obtained.

Furthermore, in the electroacoustic transducer of the present invention, each electroacoustic transduction unit has an independent enclosure. Therefore, even when a plurality of electroacoustic transduction units are disposed, the volume of the enclosure is not insufficient and there is no difficulty in reproducing a low band.

Moreover, in the case of the HVT speaker, the driving source (a magnet or voice coil) is disposed at the side surface of the vibration plate. Therefore, even when the polyhedron such as a regular hexahedron is formed by using the HVT speakers, the interval between the vibration plates increases, it is difficult to effectively increase the radiation impedance, and it is difficult to realize 360° omnidirectionality.

On the other hand, in the electroacoustic transducer of the present invention, the polyhedron such as a regular hexahedron (cube) can be substantially formed only by the vibration plates. Therefore, along with the effect of amplifying the low band caused by a significant increase in the radiation impedance, a sound with high acoustic quality can be radiated from a wide band at 360° in all directions. Accordingly, the entire room in which the speaker is installed can be a listening point, and an acoustic space which is likely to be surrounded can be created.

Here, in the example illustrated in FIG. 1A, the six transduction units are disposed to form a regular hexahedron, but the polyhedron is not limited thereto. The polyhedron constituted by a plurality of the transduction units may be a regular polyhedron such as a regular tetrahedron, regular octahedron, or regular dodecahedron, a semiregular polyhedron such as a truncated tetrahedron, truncated hexahedron, truncated octahedron, truncated dodecahedron, or truncated icosahedron, or a quasiregular polyhedron such as a cuboctahedron or icosidodecaheron.

In a case where the polyhedron constituted by a plurality of the transduction units is a regular polyhedron, a semi-regular polyhedron, and a quasiregular polyhedron, the shape of the transduction unit is a regular polygonal shape. Therefore, it is preferable that the shape of the bent portion (vibration surface) of the transduction unit is also a regular polygonal shape similar to the shape of the transduction unit.

In the illustrated example, the configuration in which the six transduction units are disposed so as to cause all faces of the regular hexahedron to be constituted by the transduction units is provided, but the polyhedron is not limited thereto, and some of the faces of the polyhedron may be constituted by the transduction units.

For example, as illustrated in FIG. 7A, which will be described later, the polyhedron may also be a regular hexahedron in which four transduction units 40 are provided, the extension directions of one side of the transduction films 10 (bent portions) in the four transduction units 40 are aligned with each other, the bent portions of the transduction units 40 form a substantially square shape in a cross section perpendicular to the one side while the bent portions are disposed to face different directions from each other, and two openings of the space enclosed by the four transduction units 40 are provided with lid members 122 having substantially the same size as the openings.

The number of transduction units constituting some of the faces of the polyhedron is preferably more than or equal to 20% of the number of faces of the polyhedron, and more preferably more than or equal to 50%.

In a case where some of the faces of the polyhedron are constituted by the transduction units, the transduction units are preferably disposed adjacent to each other, and more preferably disposed with center symmetry. In this manner, the respective transduction units connect points to the center of the polyhedron (housing) and ideal point sound source reproduction is achieved, which contributes to omnidirectionality.

A configuration in which cone speaker units are disposed in some of the faces of the polyhedron with the radiation surfaces facing outward may also be provided.

Figure 3:
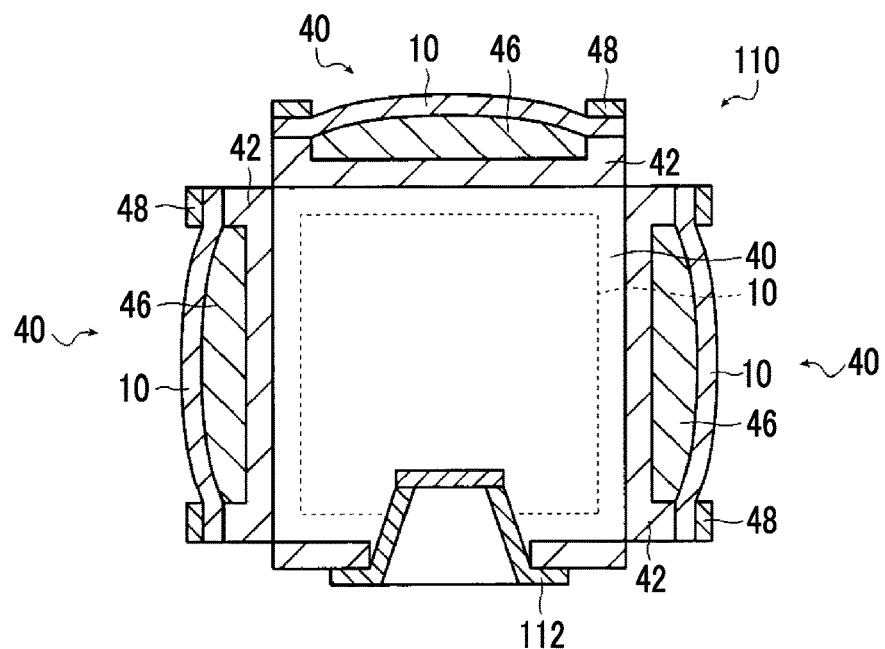
FIG. 3 is a sectional view schematically illustrating another example of the electroacoustic transducer of the present invention.

For example, an electroacoustic transducer 110 illustrated in FIG. 3 includes five transduction units 40 and a single cone speaker unit 112, and these units are disposed to constitute a regular hexahedron.

In a case of this configuration, as the cone speaker unit 112, a so-called subwoofer unit capable of suitably reproducing a low band is preferably used. Accordingly, the internal cavity of the polyhedron (housing) can be effectively utilized as an enclosure, and thus a subwoofer which is excellent in low band reproduction can be realized.

Next, an electroacoustic transduction film used in the electroacoustic transducer of the present invention will be described.

Figure 4:
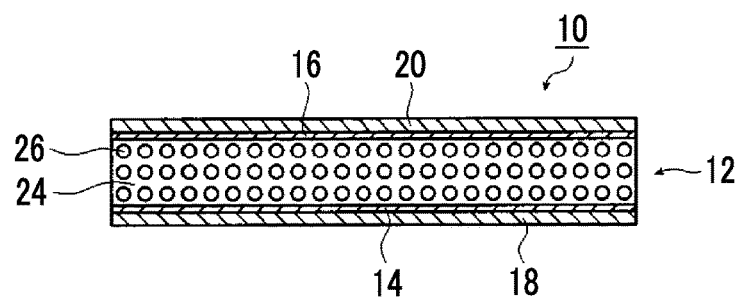
FIG. 4 is a sectional view conceptually illustrating an example of an electroacoustic transduction film of the present invention.

FIG. 4 is a sectional view conceptually illustrating an example of the transduction film 10.

As illustrated in FIG. 4, the transduction film 10 includes a piezoelectric layer 12 which is a sheet-like material having piezoelectric properties, a lower thin film electrode 14 laminated on one surface of the piezoelectric layer 12, a lower protective layer 18 laminated on the lower thin film electrode 14, an upper thin film electrode 16 laminated on the other surface of the piezoelectric layer 12, and an upper protective layer 20 laminated on the upper thin film electrode 16.

In the transduction film 10, the piezoelectric layer 12 which is a polymer composite piezoelectric body, as conceptually illustrated in FIG. 4, is a polymer composite piezoelectric body in which piezoelectric body particles 26 are uniformly dispersed in a viscoelastic matrix 24 formed of a polymer material having viscoelasticity at a normal temperature. Furthermore, herein, the "normal temperature" indicates a temperature range of approximately 0° C. to 50° C.

Although described later, the piezoelectric layer 12 is preferably subjected to polarization processing.

The transduction film 10 is suitably used in a speaker having flexibility such as a speaker for a flexible display. Here, it is preferable that the polymer composite piezoelectric body (the piezoelectric layer 12) used in a speaker having flexibility has the following requisites.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. At this time, when the polymer composite piezoelectric body is hard, large bending stress is generated to that extent, and a crack is generated at the interface between the polymer matrix and the piezoelectric body particles, possibly leading to breakage. Accordingly, the polymer composite piezoelectric body is required to have suitable flexibility. In addition, when strain energy is diffused into the outside as heat, the stress is able to be relieved. Accordingly, the loss tangent of the polymer composite piezoelectric body is required to be suitably large.

(ii) Acoustic Quality

In the speaker, the piezoelectric body particles vibrate at a frequency of an audio band of 20 Hz to 20 kHz, and the entire vibration plate (the polymer composite piezoelectric body) integrally vibrates due to the vibration energy such that a sound is reproduced. Accordingly, in order to increase the transmission efficiency of the vibration energy, the polymer composite piezoelectric body is required to have suitable hardness. In addition, when the frequency properties of the speaker become smooth, the changed amount of the acoustic quality at the time of when the lowest resonance frequency $f_0$ changes according to a change in the curvature also decreases. Accordingly, the loss tangent of the polymer composite piezoelectric body is required to be suitably large.

As described above, the polymer composite piezoelectric body used in the speaker having flexibility is required to be rigid with respect to a vibration of 20 Hz to 20 kHz, and be flexible with respect to a vibration of less than or equal to a few Hz. In addition, the loss tangent of the polymer composite piezoelectric body is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 12), the polymer material of which the glass transition point is a normal temperature, in other words, the polymer material having viscoelasticity at a normal temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of preferably exhibiting such behavior, it is preferable that a polymer material of which the glass transition temperature at a frequency of 1 Hz is a normal temperature, that is, 0° C. to 50° C. is used in the matrix of the polymer composite piezoelectric body.

As the polymer material having viscoelasticity at a normal temperature, various known materials are able to be used. Preferably, a polymer material of which the local maximum value of a loss tangent Tan δ at a frequency of 1 Hz at a normal temperature, that is, 0° C. to 50° C. in a dynamic viscoelasticity test is greater than or equal to 0.5 is used.

Accordingly, when the polymer composite piezoelectric body is slowly bent due to an external force, stress concentration on the interface between the polymer matrix and the piezoelectric body particles at the maximum bending moment portion is relieved, and thus high flexibility is able to be expected.

In addition, it is preferable that, in the polymer material, a storage elastic modulus (E') at a frequency of 1 Hz according to the dynamic viscoelasticity measurement is greater than or equal to 100 MPa at 0° C. and is less than or equal to 10 MPa at 50° C.

Accordingly, it is possible to reduce a bending moment which is generated at the time of when the polymer composite piezoelectric body is slowly bent due to the external force, and it is possible to make the polymer composite piezoelectric body rigid with respect to an acoustic vibration of 20 Hz to 20 kHz.

In addition, it is more preferable that the relative permittivity of the polymer material is greater than or equal to 10 at 25° C. Accordingly, when a voltage is applied to the polymer composite piezoelectric body, a higher electric field is applied to the piezoelectric body particles in the polymer matrix, and thus a large deformation amount is able to be expected.

However, in consideration of ensuring excellent moisture resistance or the like, it is preferable that the relative permittivity of the polymer material is less than or equal to 10 at 25° C.

As the polymer material satisfying such conditions, cyanoethylated polyvinyl alcohol (cyanoethylated PVA), polyvinyl acetate, polyvinylidene chloride-co-acrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used. Among them, a material having a cyanoethyl group is preferably used, and cyanoethylated PVA is particularly preferably used.

Furthermore, only one of these polymer materials may be used, or a plurality of types thereof may be used in combination (mixture).

The viscoelastic matrix 24 using such a polymer material having viscoelasticity at a normal temperature, as necessary, may use a plurality of polymer materials in combination.

That is, in order to adjust dielectric properties or mechanical properties, other dielectric polymer materials may be added to the viscoelastic matrix 24 in addition to the viscoelastic material such as cyanoethylated PVA, as necessary.

As the dielectric polymer material which is able to be added to the matrix 24, for example, a fluorine-based polymer such as polyvinylidene fluoride, a vinylidene fluoride-tetrafluoroethylene copolymer, a vinylidene fluoride-trifluoroethylene copolymer, a polyvinyl idene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, a synthetic rubber such as nitrile rubber or chloroprene rubber, and the like are exemplified.

Among them, a polymer material having a cyanoethyl group is suitably used.

Furthermore, the dielectric polymer added to the viscoelastic matrix 24 of the piezoelectric layer 12 in addition to the material having viscoelasticity at a normal temperature such as cyanoethylated PVA is not limited to one dielectric polymer, and a plurality of dielectric polymers may be added.

In addition, in order to adjust the glass transition point (Tg), a theinioplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added in addition to the dielectric polymer material.

Furthermore, in order to improve pressure sensitive adhesiveness, a viscosity imparting agent such as rosin ester, rosin, terpene, terpene phenol, and a petroleum resin may be added.

In the viscoelastic matrix 24 of the piezoelectric layer 12, the added amount at the time of adding a polymer in addition to the viscoelastic material such as cyanoethylated PVA is not particularly limited, and it is preferable that a ratio of the added polymer to the viscoelastic matrix 24 is less than or equal to 30 vol %.

Accordingly, it is possible to exhibit properties of the polymer material to be added without impairing the viscoelasticity relieving mechanism of the viscoelastic matrix 24, and thus a preferred result is able to be obtained from a viewpoint of increasing a dielectric constant, of improving heat resistance, and of improving adhesiveness between the piezoelectric body particles 26 and the electrode layer.

The piezoelectric body particles 26 are formed of ceramics particles having a perovskite type or wurtzite type crystal structure.

As the ceramics particles configuring the piezoelectric body particles 26, for example, lead zirconate titanate (PZT), lead lanthanum zirconate titanate (PLZT), barium titanate ($BaTiO_3$), zinc oxide (ZnO), a solid solution (BFBT) of barium titanate and bismuth ferrite ($BiFe_3$), and the like are exemplified.

The particle diameter of the piezoelectric body particles 26 may be appropriately selected according to the size or usage of the transduction film 10, and is preferably 1 μm to 10 μm according to the consideration of the present inventors.

By setting the particle diameter of the piezoelectric body particles 26 to be in the range described above, a preferred result is able to be obtained from a viewpoint of making high piezoelectric properties and flexibility compatible.

In addition, in FIG. 4, the piezoelectric body particles 26 in the piezoelectric layer 12 are uniformly dispersed in the viscoelastic matrix 24 with regularity. However, the present invention is not limited thereto.

That is, in the viscoelastic matrix 24, the piezoelectric body particles 26 in the piezoelectric layer 12 are preferably uniformly dispersed, and may also be irregularly dispersed.

In the transduction film 10, a quantitative ratio of the viscoelastic matrix 24 and the piezoelectric body particles 26 in the piezoelectric layer 12 may be appropriately set according to the size in the surface direction or the thickness of the transduction film 10, the usage of the transduction film 10, properties required for the transduction film 10, and the like.

Here, according to the consideration of the present inventors, the volume fraction of the piezoelectric body particles 26 in the piezoelectric layer 12 is preferably 30% to 70%, particularly preferably greater than or equal to 50%. Therefore, the volume fraction thereof is more preferably 50% to 70%.

By setting the quantitative ratio of the viscoelastic matrix 24 and the piezoelectric body particles 26 to be in the range described above, it is possible to obtain a preferred result from a viewpoint of making high piezoelectric properties and flexibility compatible.

In addition, in the transduction film 10, the thickness of the piezoelectric layer 12 is also not particularly limited, and may be appropriately set according to the size of the transduction film 10, the usage of the transduction film 10, properties required for the transduction film 10, and the like.

Here, according to the consideration of the present inventors, the thickness of the piezoelectric layer 12 is preferably 10 to 300 μm, more preferably 20 to 200 μm, and particularly preferably 30 to 100 μm.

By setting the thickness of the piezoelectric layer 12 to be in the range described above, it is possible to obtain a preferred result from a viewpoint of making ensuring rigidity and appropriate flexibility compatible.

Furthermore, as described above, it is preferable that the piezoelectric layer 12 is subjected to polarization processing (poling). The polarization processing will be described below in detail.

As illustrated in FIG. 4, the transduction film 10 of the present invention has a configuration in which the lower thin film electrode 14 is formed on one surface of the piezoelectric layer 12, the lower protective layer 18 is formed thereon, the upper thin film electrode 16 is formed on the other surface of the piezoelectric layer 12, and the upper protective layer 20 is formed thereon. Here, the upper thin film electrode 16 and the lower thin film electrode 14 form an electrode pair.

In addition to these layers, the transduction film 10 may further include, for example, an electrode lead-out portion that leads out the electrodes from the upper thin film electrode 16 and the lower thin film electrode 14, and an insulating layer which covers a region where the piezoelectric layer 12 is exposed for preventing a short circuit or the like.

That is, the transduction film 10 has a configuration in which both surfaces of the piezoelectric layer 12 are interposed between the electrode pair, that is, the upper thin film electrode 16 and the lower thin film electrode 14 and this laminated body is interposed between the upper protective layer 20 and the lower protective layer 18.

The region interposed between the upper thin film electrode 16 and the lower thin film electrode 14 as described above is driven according to an applied voltage.

In the transduction film 10, the upper protective layer 20 and the lower protective layer 18 have a function of applying appropriate rigidity and mechanical strength to the piezoelectric layer 12. That is, there may be a case where, in the transduction film 10 of the present invention, the piezoelectric layer 12 consisting of the viscoelastic matrix 24 and the piezoelectric body particles 26 exhibits extremely superior flexibility under bending deformation at a slow vibration but has insufficient rigidity or mechanical strength depending on the usage. As a compensation for this, the transduction film 10 is provided with the upper protective layer 20 and the lower protective layer 18.

The upper protective layer 20 and the lower protective layer 18 are not particularly limited, and may use various sheet-like materials. As an example, various resin films are suitably exemplified. Among them, by the reason of excellent mechanical properties and heat resistance, polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyamide (PA), polyethylene naphthalate (PEN), triacetylcellulose (TAC), and a cyclic olefin-based resin are suitably used.

The thicknesses of the upper protective layer 20 and the lower protective layer 18 are not particularly limited. In addition, the thicknesses of the upper protective layer 20 and the lower protective layer 18 may basically be identical to each other or different from each other.

Here, when the rigidity of the upper protective layer 20 and the lower protective layer 18 excessively increases, not only is the stretching and contracting of the piezoelectric layer 12 constrained, but also the flexibility is impaired, and thus it is advantageous when the thicknesses of the upper protective layer 20 and the lower protective layer 18 become thinner unless mechanical strength or excellent handling ability as a sheet-like material is required.

According to the consideration of the present inventors, when the thickness of each of the upper protective layer 20 and the lower protective layer 18 is less than or equal to twice the thickness of the piezoelectric layer 12, it is possible to obtain a preferred result from a viewpoint of compatibility between ensuring the rigidity and appropriate flexibility, or the like.

For example, in a case where the thickness of the piezoelectric layer 12 is 50 μm and the upper protective layer 20 and the lower protective layer 18 are formed of PET, the thickness of each of the upper protective layer 20 and the lower protective layer 18 is preferably less than or equal to 100 μm, more preferably less than or equal to 50 μm, and particularly preferably less than or equal to 25 μm.

In the transduction film 10, the upper thin film electrode (hereinafter, also referred to as an upper electrode) 16 is formed between the piezoelectric layer 12 and the upper protective layer 20, and the lower thin film electrode (hereinafter, also referred to as a lower electrode) 14 is formed between the piezoelectric layer 12 and the lower protective layer 18.

The upper electrode 16 and the lower electrode 14 are provided to apply an electric field to the transduction film 10 (the piezoelectric layer 12).

In the present invention, a forming material of the upper electrode 16 and the lower electrode 14 is not particularly limited, and as the forming material, various conductive bodies are able to be used. Specifically, carbon, graphene, palladium, iron, tin, aluminum, nickel, platinum, gold, silver, copper, chromium, molybdenum, or an alloy thereof, indium-tin oxide, and the like are exemplified. Among them, any one of copper, aluminum, gold, silver, platinum, and indium-tin oxide is suitably exemplified.

In addition, a forming method of the upper electrode 16 and the lower electrode 14 is not particularly limited, and as the forming method, various known methods such as a vapor-phase deposition method (a vacuum film forming method) such as vacuum vapor deposition or sputtering, film formation using plating, and a method of adhering a foil formed of the materials described above are able to be used.

Among them, in particular, by the reason that the flexibility of the transduction film 10 is able to be ensured, a copper or aluminum thin film formed by using the vacuum vapor deposition is suitably used as the upper electrode 16 and the lower electrode 14. Among them, in particular, the copper thin film formed by using the vacuum vapor deposition is suitably used.

The thicknesses of the upper electrode 16 and the lower electrode 14 are not particularly limited. In addition, the thicknesses of the upper electrode 16 and the lower electrode 14 may basically be identical to each other or different from each other.

Here, like the upper protective layer 20 and the lower protective layer 18 described above, when the rigidity of the upper electrode 16 and the lower electrode 14 excessively increases, not only is stretching and contracting of the piezoelectric layer 12 constrained, but also flexibility is impaired. For this reason, when the upper electrode 16 and the lower electrode 14 are in a range where electrical resistance does not excessively increase, it is advantageous when the thickness becomes thinner.

In addition, according to the consideration of the present inventors, when the product of the thicknesses of the upper electrode 16 and the lower electrode 14 and the Young's modulus is less than the product of the thicknesses of the upper protective layer 20 and the lower protective layer 18 and the Young's modulus, the flexibility is not considerably impaired, which is suitable.

For example, in a case of a combination of the upper protective layer 20 and the lower protective layer 18 formed of PET (Young's modulus: approximately 6.2 GPa) and the upper electrode 16 and the lower electrode 14 formed of copper (Young's modulus: approximately 130 GPa), when the thickness of the upper protective layer 20 and the lower protective layer 18 are 25 μm, the thickness of the upper electrode 16 and the lower electrode 14 are preferably less than or equal to 1.2 μm, more preferably less than or equal to 0.3 μm, and particularly preferably less than or equal to 0.1 μm.

As described above, the transduction film 10 has a configuration in which the piezoelectric layer 12 in which the piezoelectric body particles 26 are dispersed in the viscoelastic matrix 24 having viscoelasticity at a normal temperature is interposed between the upper electrode 16 and the lower electrode 14, and this laminated body is interposed between the upper protective layer 20 and the lower protective layer 18.

In the transduction film 10, it is preferable that the local maximum value in which the loss tangent (Tan δ) at a frequency of 1 Hz according to the dynamic viscoelasticity measurement is greater than or equal to 0.1 exists at a normal temperature.

Accordingly, even when the transduction film 10 is subjected to large bending deformation from the outside at a comparatively slow vibration of less than or equal to a few Hz, it is possible to effectively diffuse the strain energy to the outside as heat, and thus it is possible to prevent a crack from being generated on the interface between the polymer matrix and the piezoelectric body particles.

In the transduction film 10, it is preferable that the storage elastic modulus (E') at a frequency of 1 Hz according to the dynamic viscoelasticity measurement is 10 GPa to 30 GPa at 0° C., and 1 GPa to 10 GPa at 50° C.

Accordingly, the transduction film 10 is able to have large frequency dispersion in the storage elastic modulus (E') at a normal temperature. That is, the transduction film 10 is able to be rigid with respect to a vibration of 20 Hz to 20 kHz, and is able to be flexible with respect to a vibration of less than or equal to a few Hz.

In addition, in the transduction film 10, it is preferable that the product of the thickness and the storage elastic modulus (E') at a frequency of 1 Hz according to the dynamic viscoelasticity measurement is $1.0 \times 10^6$ N/m to $2.0 \times 10^6$ (1.0 E+06 to 2.0 E+06) N/m at 0° C., and $1.0 \times 10^5$ N/m to $1.0 \times 10^6$ (1.0 E+05 to 1.0 E+06) N/m at 50° C.

Accordingly, the transduction film 10 is able to have appropriate rigidity and mechanical strength within a range not impairing the flexibility and the acoustic properties of the transduction film 10.

Furthermore, in the transduction film 10, it is preferable that the loss tangent (Tan δ) at a frequency of 1 kHz at 25° C. is greater than or equal to 0.05 in a master curve obtained by the dynamic viscoelasticity measurement.

Accordingly, the frequency properties of the speaker using the transduction film 10 become smooth, and thus it is also possible to decrease the changed amount of the acoustic quality at the time of when the lowest resonance frequency $f_0$ is changed according to the change in the curvature of the speaker.

Hereinafter, an example of a manufacturing method of the transduction film 10 will be described with reference to FIGS. 5A to 5E.

Figure 5A:
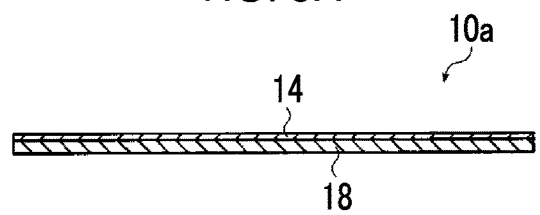
FIG. 5A is a conceptual view for explaining an example of a manufacturing method of the electroacoustic transduction film.

First, as illustrated in FIG. 5A, a sheet-like material 10a is prepared in which the lower electrode 14 is formed on the lower protective layer 18. The sheet-like material 10a may be prepared by forming a copper thin film or the like as the lower electrode 14 on the surface of the lower protective layer 18 using vacuum vapor deposition, sputtering, plating, and the like.

When the lower protective layer 18 is extremely thin, and thus the handling ability is degraded, the lower protective layer 18 with a separator (temporary supporter) may be used as necessary. As the separator, a PET film having a thickness of approximately 25 to 100 μm, and the like are able to be used. The separator may be removed after thermal compression bonding of the thin film electrode and the protective layer immediately before forming a side surface insulating layer, a second protective layer, and the like.

On the other hand, a coating material is prepared by dissolving a polymer material (hereinafter, also referred to as a viscoelastic material) having viscoelasticity at a normal temperature, such as cyanoethylated PVA, in an organic solvent, further adding the piezoelectric body particles 26 such as PZT particles thereto, and stirring and dispersing the resultant. The organic solvent is not particularly limited, and as the organic solvent, various organic solvents such as dimethylformamide (DMF), methyl ethyl ketone, and cyclohexanone are able to be used.

When the sheet-like material 10a described above is prepared and the coating material is prepared, the coating material is cast (applied) onto the surface of the sheet-like material, and the organic solvent is evaporated and dried. Accordingly, as illustrated in FIG. 5B, a laminated body 10b in which the lower electrode 14 is provided on the lower protective layer 18 and the piezoelectric layer 12 is formed on the lower electrode 14 is prepared.

A casting method of the coating material is not particularly limited, and as the casting method, all known methods (coating devices) such as a slide coater or a doctor blade are able to be used.

Figure 5B:
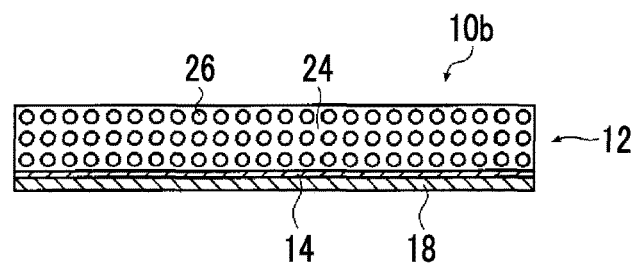
FIG. 5B is a conceptual view for explaining the example of the manufacturing method of the electroacoustic transduction film.

Alternatively, when the viscoelastic material is a material that is able to be heated and melted like cyanoethylated PVA, a melted material is prepared by heating and melting the viscoelastic material and adding and dispersing the piezoelectric body particles 26 therein, is extruded into a sheet shape on the sheet-like material 10a illustrated in FIG. 5A by extrusion molding or the like, and is cooled, thereby preparing the laminated body 10b in which the lower electrode 14 is provided on the lower protective layer 18 and the piezoelectric layer 12 is formed on the lower electrode 14 as illustrated in FIG. 5B.

In addition, as described above, in the transduction film 10, in addition to the viscoelastic material such as cyanoethylated PVA, a polymer piezoelectric material such as PVDF may be added to the viscoelastic matrix 24.

When the polymer piezoelectric material is added to the viscoelastic matrix 24, the polymer piezoelectric material added to the coating material may be dissolved. Alternatively, the polymer piezoelectric material to be added may be added to the heated and melted viscoelastic material and may be heated and melted.

When the laminated body 10b in which the lower electrode 14 is provided on the lower protective layer 18 and the piezoelectric layer 12 is formed on the lower electrode 14, is prepared, it is preferable that the piezoelectric layer 12 is subjected to polarization processing (poling).

A polarization processing method of the piezoelectric layer 12 is not particularly limited, and as the polarization processing method, a known method is able to be used. As a preferred polarization processing method, a method illustrated in FIGS. 5C and 5D is exemplified.

Figure 5C:
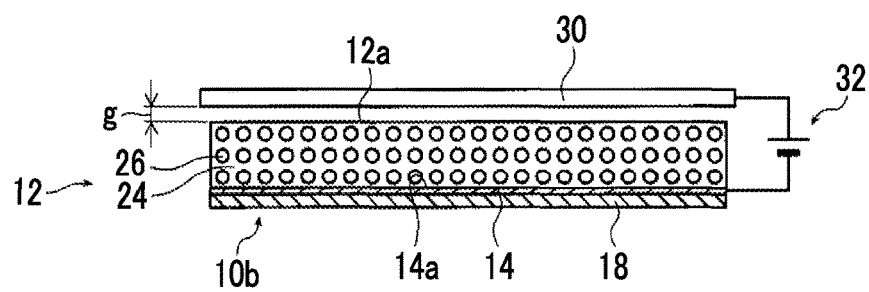
FIG. 5C is a conceptual view for explaining the example of the manufacturing method of the electroacoustic transduction film.
Figure 5D:
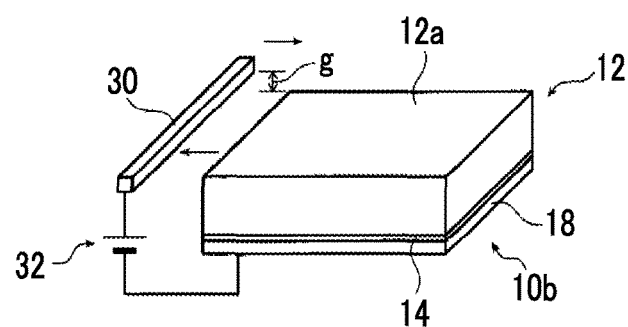
FIG. 5D is a conceptual view for explaining the example of the manufacturing method of the electroacoustic transduction film.

In this method, as illustrated in FIGS. 5C and 5D, for example, a gap g of 1 mm is opened on an upper surface 12a of the piezoelectric layer 12 of the laminated body 10b, and a rod-like or wire-like corona electrode 30 which is able to be moved along the upper surface 12a is disposed. Then, the corona electrode 30 and the lower electrode 14 are connected to a direct-current power source 32.

Furthermore, heating means for heating and holding the laminated body 10b, for example, a hot plate, is prepared.

Then, in a state where the piezoelectric layer 12 is heated and held by the heating means, for example, at a temperature of 100° C., a direct-current voltage of a few kV, for example, 6 kV, is applied between the lower electrode 14 and the corona electrode 30 from the direct-current power source 32, and thus a corona discharge occurs. Furthermore, in a state where the gap g is maintained, the corona electrode 30 is moved (scanned) along the upper surface 12a of the piezoelectric layer 12, and the piezoelectric layer 12 is subjected to the polarization processing.

During the polarization processing using the corona discharge (hereinafter, for convenience, also referred to as corona poling processing), known rod-like moving means may be used to move the corona electrode 30.

In addition, in the corona poling processing, a method of moving the corona electrode 30 is not limited. That is, the corona electrode 30 is fixed, a moving mechanism for moving the laminated body 10b is provided, and the polarization processing may be performed by moving the laminated body 10b. Moving means for a known sheet-like material may be used to move the laminated body 10b.

Furthermore, the number of corona electrodes 30 is not limited to one, and the corona poling processing may be performed by using a plurality of lines of corona electrodes 30.

In addition, the polarization processing is not limited to the corona poling processing, and normal electric field poling in which a direct-current electric field is directly applied to an object to be subjected to the polarization processing may also be used. However, in a case where this normal electric field poling is performed, it is necessary that the upper electrode 16 is formed before the polarization processing.

Before the polarization processing, calender processing may be performed to smoothen the surface of the piezoelectric layer 12 using a heating roller or the like. By performing the calender processing, a thermal compression bonding process described below is able to be smoothly performed.

In this way, while the piezoelectric layer 12 of the laminated body 10b is subjected to the polarization processing, a sheet-like material 10c is prepared in which the upper electrode 16 is formed on the upper protective layer 20. This sheet-like material 10c may be prepared by forming a copper thin film or the like as the upper electrode 16 on the surface of the upper protective layer 20 using vacuum vapor deposition, sputtering, plating, and the like.

Figure 5E:
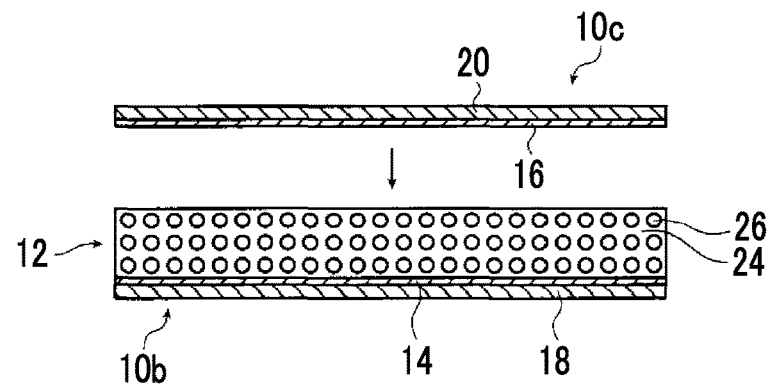
FIG. 5E is a conceptual view for explaining the example of the manufacturing method of the electroacoustic transduction film.

Next, as illustrated in FIG. 5E, the sheet-like material 10c is laminated on the laminated body 10b in which the piezoelectric layer 12 is subjected to the polarization processing while the upper electrode 16 faces the piezoelectric layer 12.

Furthermore, a laminated body of the laminated body 10b and the sheet-like material 10c is interposed between the upper protective layer 20 and the lower protective layer 18, and is subjected to the thermal compression bonding using a heating press device, a heating roller pair, or the like such that the transduction film 10 is prepared.

As described above, the electroacoustic transducer of the present invention are described in detail, but the present invention is not limited to the examples described above, and various improvements or modifications may be performed within a range not deviating from the gist of the present invention.

EXAMPLES

Hereinafter, the present invention will be described in more detail with reference to specific examples of the present invention.

Example 1

According to the method illustrated in FIGS. 5A to 5E described above, the transduction film 10 of the present invention illustrated in FIG. 4 was prepared.

First, cyanoethylated PVA (CR-V manufactured by Shin-Etsu Chemical Co., Ltd.) was dissolved in dimethylformamide (DMF) at the following compositional ratio. Thereafter, PZT particles were added to this solution at the following compositional ratio, and were dispersed by using a propeller mixer (rotation speed 2000 rpm), and thus a coating material for forming the piezoelectric layer 12 was prepared.

PZT Particles 300 parts by mass
Cyanoethylated PVA 30 parts by mass
DMF 70 parts by mass In addition, the PZT particles were obtained by sintering commercially available PZT raw material powder at 1000° C. to 1200° C. and thereafter crushing and classifying the resultant so as to have an average particle diameter of 5 µm.

On the other hand, the sheet-like materials 10a and 10c were prepared in which a copper thin film having a thickness of 0.1 µm was vacuum vapor deposited on a PET film having a thickness of 4 µm. That is, in this example, the upper electrode 14 and the lower electrode 16 are copper vapor deposition thin films having a thickness of 0.1 µm, and the upper protective layer 20 and the lower protective layer 18 are PET films having a thickness of 4 µm.

In order to obtain good handling ability during the process, as the PET film, a film with a separator (temporary supporter PET) having a thickness of 50 µm attached thereto was used, and the separator of each protective layer was removed after thermal compression bonding of the thin film electrode and the protective layer.

The coating material for forming the piezoelectric layer 12 prepared as described above was applied onto the lower electrode 14 of the sheet-like material 10a (the copper vapor deposition thin film) by using a slide coater. Furthermore, the coating material was applied such that the film thickness of the coating film after being dried was 40 µm.

Next, a material in which the coating material was applied onto the sheet-like material 10a was heated and dried on a hot plate at 120° C. such that DMF was evaporated. Accordingly, the laminated body 10b was prepared in which the lower electrode 14 made of copper was formed on the lower protective layer 18 made of PET, and the piezoelectric layer 12 (piezoelectric layer) having a thickness of 40 µm was formed thereon.

The piezoelectric layer 12 of the laminated body 10b was subjected to the polarization processing by corona poling illustrated in FIGS. 5C and 5D. Furthermore, the polarization processing was performed by setting the temperature of the piezoelectric layer 12 to 100° C., and applying a direct-current voltage of 6 kV between the lower electrode 14 and the corona electrode 30 so as to cause corona discharge to occur.

The sheet-like material 10c was laminated on the laminated body 10b which was subjected to the polarization processing while the upper electrode 16 (copper thin film side) faced the piezoelectric layer 12.

Next, the laminated body of the laminated body 10b and the sheet-like material 10c was subjected to thermal compression bonding at 120° C. by using a laminator device, and thus the piezoelectric layer 12 adhered to the upper electrode 16 and the lower electrode 14 such that the transduction film 10 was prepared.

The transduction unit 40 was prepared by assembling the prepared transduction film 10 into the case 42.

Here, the size of the bent portion of the transduction unit 40 was set to 170 mm×170 mm.

The case 42 is a box-shaped container having an open surface, and an aluminum rectangular container having outer dimensions of 180 mm×180 mm, an open surface size of 170 mm×170 mm and a depth of 4 mm, was used.

In addition, the viscoelastic supporter 46 was disposed in the case 42. The viscoelastic supporter 46 was made of glass wool having a height of 25 mm before assembly and a density of 32 kg/m³.

As the pressing member 48, an aluminum plate-like member in which the size of the opening 48a was 170 mm×170 mm and the thickness was 6 mm was used. That is, the width of the edge portion of the pressing member 48 was 5 mm.

The transduction film 10 was disposed so as to cover the viscoelastic supporter 46 and the opening of the case 42, the peripheral portion thereof was fixed by the pressing member 48 such that an appropriate tension and curvature were applied to the transduction film 10 by the viscoelastic supporter 46.

Six such transduction units 40 were prepared, and by disposing and fixing the respective surfaces of the six transduction units 40 on the transduction film 10 side to face outward and form a regular hexahedron (cube), the electroacoustic transducer 100 was prepared.

Example 2

As in an electroacoustic transducer 120 illustrated in FIG. 7A, four transduction units 40 were provided, the extension directions of one side of the transduction films 10 (bent portions) in the transduction units 40 were aligned with each other, the bent portions of the transduction units 40 formed a substantially square shape in a cross section perpendicular to the one side while the bent portions were disposed to face different directions from each other, and two openings of the space enclosed by the four transduction units 40 were provided with lid members 122 having substantially the same size as the openings. Therefore, the space enclosed by the four transduction units 40 is substantially sealed.

The lid member 122 was a plate-like member made of an aluminum plate having a thickness of 6 mm.

That is, the four transduction units 40 were arranged so that from one transduction unit 40 as a reference, the radial directions of sounds from the other transduction units were different by 90°, 180°, and 270°, respectively.

Reference Example 1

As illustrated in FIG. 7B, the same as in Example 2 was applied except that the member was not included.

That is, an electroacoustic transducer 202 illustrated in FIG. 7B was configured so that four transduction units 40 were provided, the extension directions of one side of the transduction films 10 (vibration surfaces) in the transduction units 40 were aligned with each other, the vibration surfaces of the transduction units 40 formed a substantially square shape in a cross section perpendicular to the one side while the vibration surfaces face different directions from each other.

In addition, the space enclosed by the four transduction units 40 communicates with the outside on the upper and lower sides in the figure.

Comparative Example 1

As illustrated in FIG. 8, the same as in Example 1 was applied except that a configuration with a single transduction unit 40 was provided.

[Evaluation]
<Frequency Properties>

The sound pressure level and frequency properties of the prepared electroacoustic transducer were measured by sine wave sweep measurement using a constant current type power amplifier. A measurement microphone was disposed at a position of 50 cm from the front surface of the center of the single transduction unit. In addition, the electroacoustic transducer was measured in a state of being suspended in mid-air.

Figure 9:
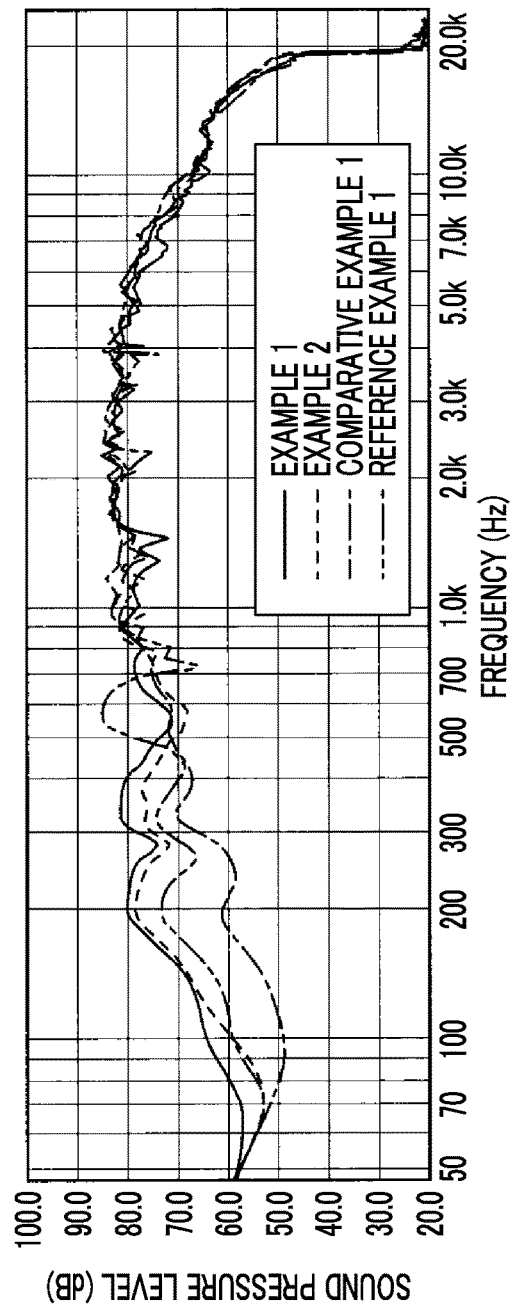
FIG. 9 is a graph showing the relationship between frequencies and sound pressure levels.

Graphs of the measurement results of the sound pressure level and frequency properties are shown in FIG. 9.

As shown in FIG. 9, it can be seen from the comparison between Examples 1 and 2 and Comparative Example 1 that although the sound pressure levels are the same in an intermediate band and a high band, the sound pressure levels of Examples 1 and 2 are high in a low band and a wide band can be achieved.

Particularly, in a low band of approximately 70 Hz to 300 Hz, the sound pressure level of Example 1 is improved by approximately ten times (+20 dB) at the maximum compared to Comparative Example 1 having the single transduction unit. That is, in Example 1, although the number of transduction units is six and six times that of Comparative Example 1, the sound pressure level is improved by ten times.

This is because the radiation impedance is significantly increased by disposing the transduction units 40 adjacent to each other in a cubic shape and thus it is possible to obtain the sound pressure amplification effect more than the number of units.

In addition, in both Example 2 and Reference Example 1, four transduction units are provided. However, the sound pressure level of Example 2 is higher in a low band.

Specifically, in a low band, Reference Example 1 is improved by approximately four times (+12 dB) at the maximum compared to Comparative Example 1. That is, it can be said that the sound pressure level is increased with the number of transduction units.

In contrast, Example 2 is approximately six times (approximately +15 dB) that of Comparative Example 1. Even from this comparison, it can be seen that the radiation impedance is significantly increased by forming a polyhedron with a plurality of transduction units and it is possible to obtain the sound pressure amplification effect more than the number of units.

Here, only in Reference Example 1, an increase in the sound pressure level near 600 Hz is observed. However, this is caused by the resonance of the air passing through the internal space of the polyhedron (housing). Even from this, it is apparent that the space closed by the upper and lower lids in Example 2 block the escape path of the air and contributes to an increase in the radiation impedance.

Next, the disposition (angle) of the microphone P was changed by rotating the speaker in Examples 1 and 2 and Comparative Example 1, and the sound pressure level and frequency properties were measured.

Figure 6:
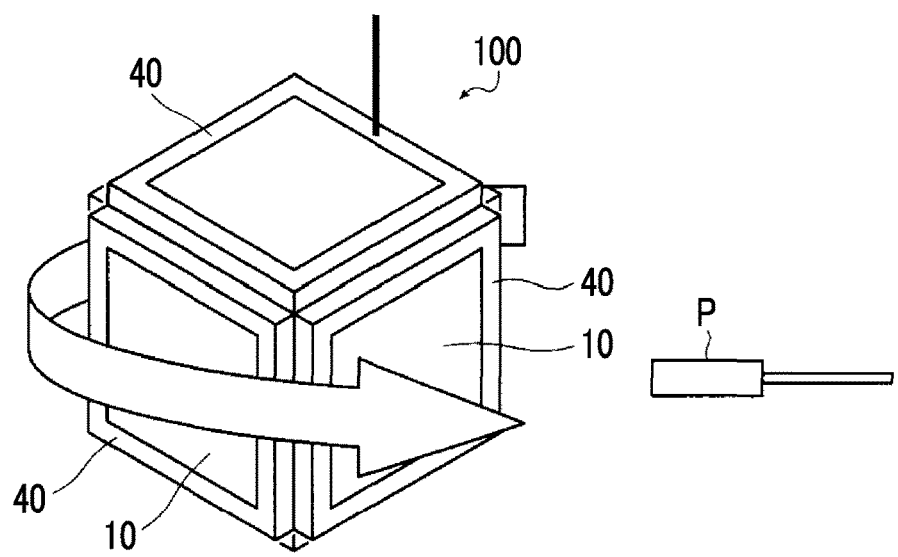
FIG. 6 is a schematic perspective view for explaining a measurement method of a sound pressure level.

Specifically, as illustrated in FIG. 6, the electroacoustic transducer was installed to be suspended in mid-air to cause one transduction unit as a reference to be parallel to the vertical direction, the position of the front surface of the transduction film of the transduction unit as the reference was set to 0°, the speaker unit was rotated to dispose the microphone P at a position at angles of 30°, 60°, 90°, and 180° about the vertical direction, and the sound pressure level and frequency properties were measured.

Figure 10A:
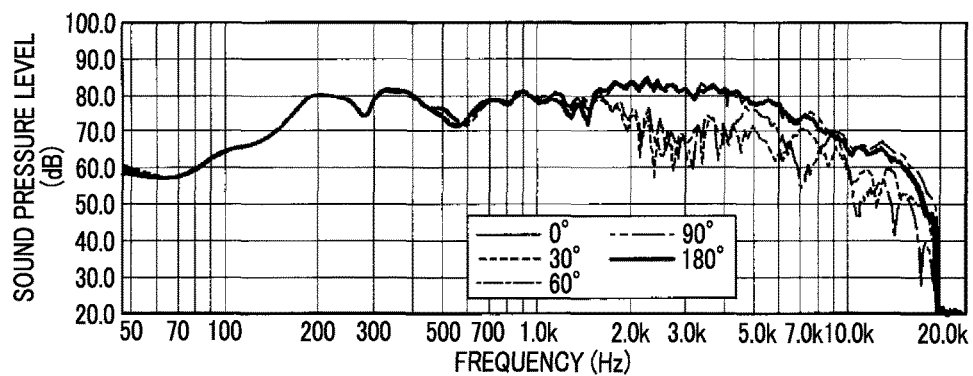
FIG. 10A is a graph showing the relationship between frequencies and sound pressure levels.
Figure 10B:
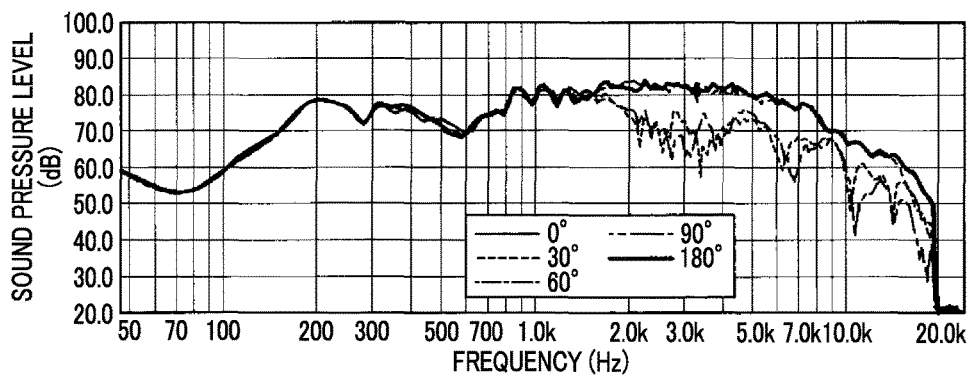
FIG. 10B is a graph showing the relationship between frequencies and sound pressure levels.
Figure 10C:
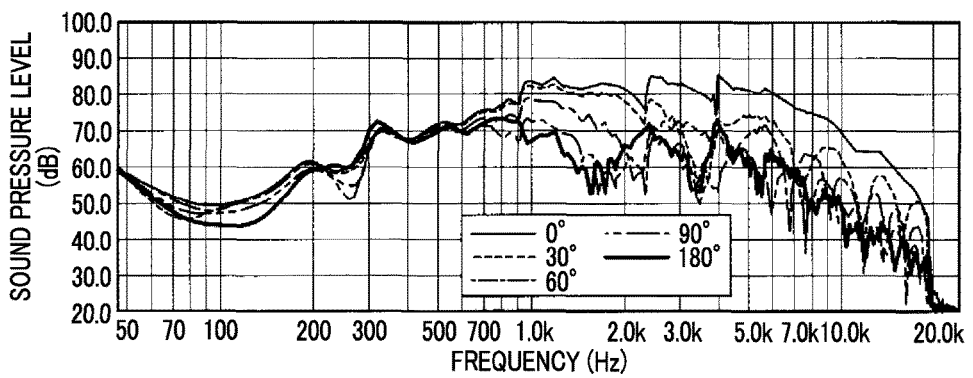
FIG. 10C is a graph showing the relationship between frequencies and sound pressure levels.

Measurement results of Example 1 are shown in FIG. 10A, measurement results of Example 2 are shown in FIG. 10B, and measurement results of Comparative Example 1 are shown in FIG. 10C.

As shown in FIG. 10C, since Comparative Example 1 has a single transduction unit, with respect to the sound pressure level at the position of the front surface (0°) of the transduction unit, the sound pressure levels at positions other than the front surface significantly decrease. Particularly, it can be seen that the decrease in the sound pressure level in a high band with high directivity is large.

In contrast, as shown in FIGS. 10A and 10B, in Examples 1 and 2, even in a case of a position of 90° and a position of 180°, the position becomes the position of front surface of another transduction unit, and thus the same sound pressure level as that at a position of 0° is obtained. In addition, it can be seen that the decrease in the sound pressure level in a high band is small even at a position of 30° and a position of 60°. Therefore, it can be seen that use as an omnidirectional speaker is possible.

Figure 12A:
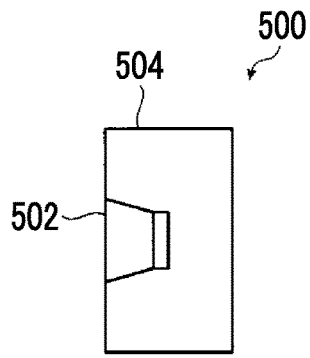
FIG. 12A is a view schematically illustrating an example of an electroacoustic transducer of the related art.
Figure 12B:
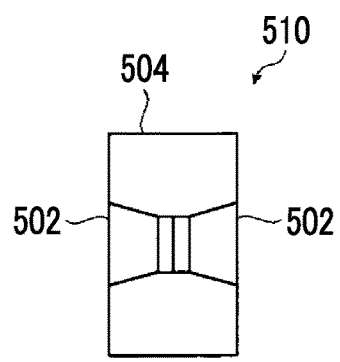
FIG. 12B is a view schematically illustrating an example of an electroacoustic transducer of the related art.
Figure 12C:
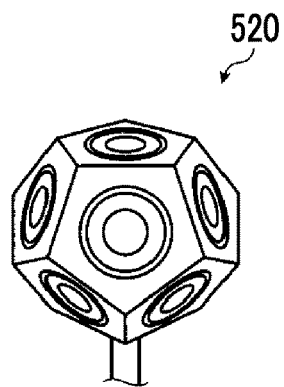
FIG. 12C is a view schematically illustrating an example of an electroacoustic transducer of the related art.

As disclosed in "technology for thinning speaker to about ⅓" (URL: http://techon.nikkeibp.co.jp/article/FEATURE/20130128/262631/) in Nikkei Technology Online, regarding each of an electroacoustic transducer 500 in which a single speaker unit 502 is attached to an enclosure 504 as illustrated in FIG. 12A, an electroacoustic transducer 510 (rear surface facing arrangement) in which two speaker units 502 are attached to an enclosure so as to cause the bent portions thereof to face opposite directions to each other as illustrated in FIG. 12B, and an electroacoustic transducer 520 (polyhedral speaker) in which a speaker unit is attached to each face of a regular dodecahedron enclosure as illustrated in FIG. 12C, the results of measuring the sound pressure level by setting a certain speaker to the front surface (0°) and changing the disposition of a microphone P as described above are shown in FIGS. 13A to 13C.

Figure 13A:
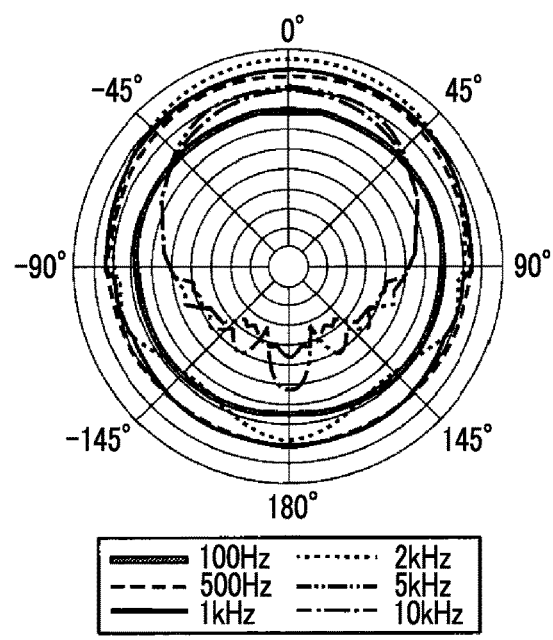
FIG. 13A is a graph showing the relationship between measurement directions and sound pressure levels.
Figure 13B:
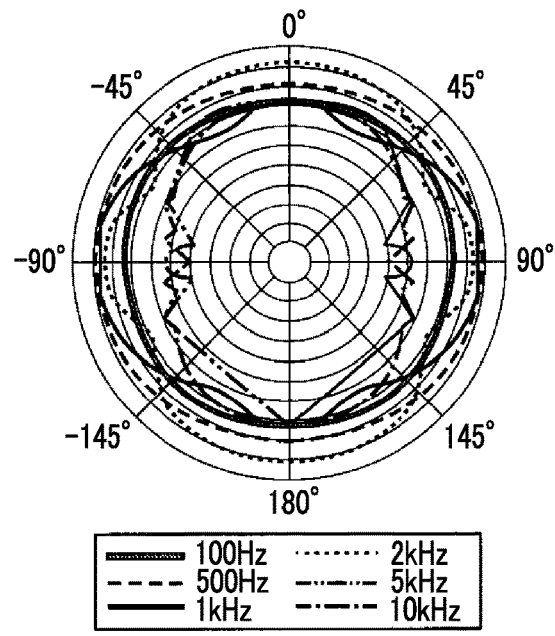
FIG. 13B is a graph showing the relationship between measurement directions and sound pressure levels.
Figure 13C:
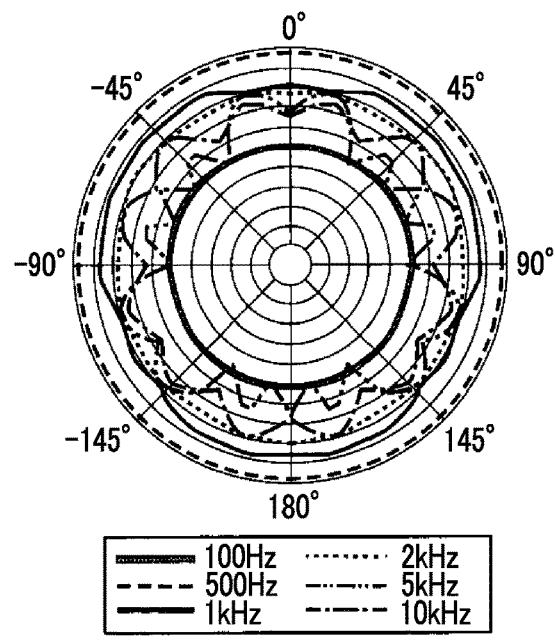
FIG. 13C is a graph showing the relationship between measurement directions and sound pressure levels.

In FIGS. 13A to 13C, a case of 100 Hz is indicated by a cross-hatched line, a case of 500 Hz is indicated by a broken line, a case of 1 kHz is indicated by a solid line, a case of 2 kHz is indicated by a dotted line, a case of 5 kHz is indicated by a two-dot chain line, and a case of 10 kHz is indicated by a one-dot chain line.

As shown in FIGS. 13A to 13C, even in the dynamic electroacoustic transducer, the sound pressure level in an intermediate to high band in directions other than the front surface is improved compared to the electroacoustic transducer with a single speaker unit by adopting the rear surface facing arrangement or the polyhedral speaker. However, the sound pressure level varies depending on the measurement position (angle), and thus a wave-like waveform is shown. For this reason, the balance between the sound pressure levels in a low band, an intermediate band, and a high band changes at a listening position, resulting in a change in tone. Therefore, it is difficult to realize an omnidirectional speaker.

This is because the interval between the speaker units (vibration plates) is large, and the phases of sounds emitted from the respective speaker units are shifted. It can be seen from FIG. 13C that in a case where a polyhedral speaker is configured by using a plurality of dynamic electroacoustic transducers, the sound pressure level in a low band (100 Hz) is significantly lowered. It is considered that this is because when a plurality of speaker units are used, the space is taken by a magnetic circuit, and thus the substantive volume of the enclosure is insufficient.

In addition, as disclosed in "technology for thinning speaker to about ⅓" (URL: http://techon.nikkeibp.co.jp/ article/FEATURE/20130128/262631/) in Nikkei Technology Online, in the case of the configuration in which HVT speakers are disposed back to back, the distance between the two vibration plates can be reduced, and there is substantially no difference in the arrival time of sound from each of the vibration plates at a microphone, and thus a speaker close to omnidirectionality can be achieved. However, the sound pressure level in a high band in the horizontal direction decreases, and sufficient omnidirectionality is not achieved.

In contrast, in Examples 1 and 2 and Comparative Example 1, the results of measuring the sound pressure level by setting a certain speaker to the front surface (0°) and changing the disposition of the microphone P as described above are shown in FIGS. 11A to 11C.

Figure 11A:
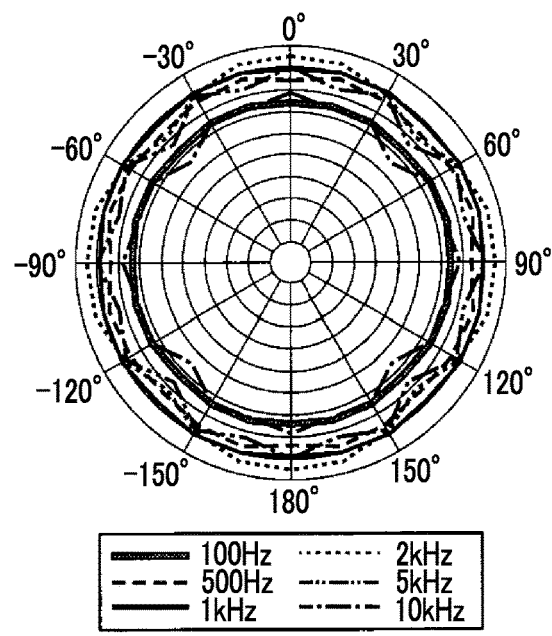
FIG. 11A is a graph showing the relationship between measurement directions and sound pressure levels.
Figure 11B:
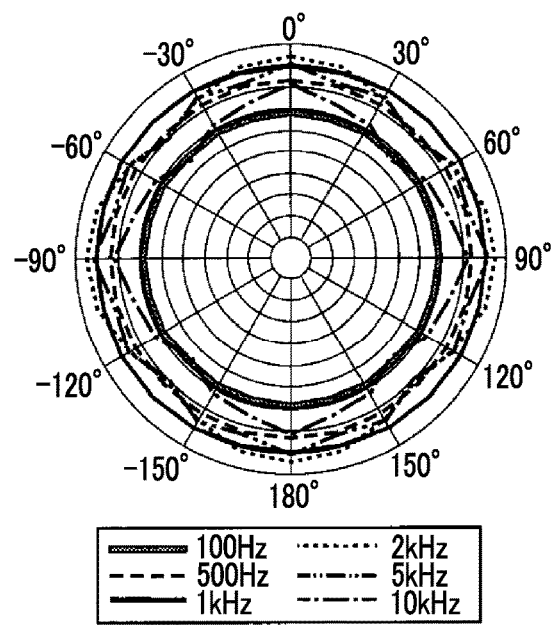
FIG. 11B is a graph showing the relationship between measurement directions and sound pressure levels.
Figure 11C:
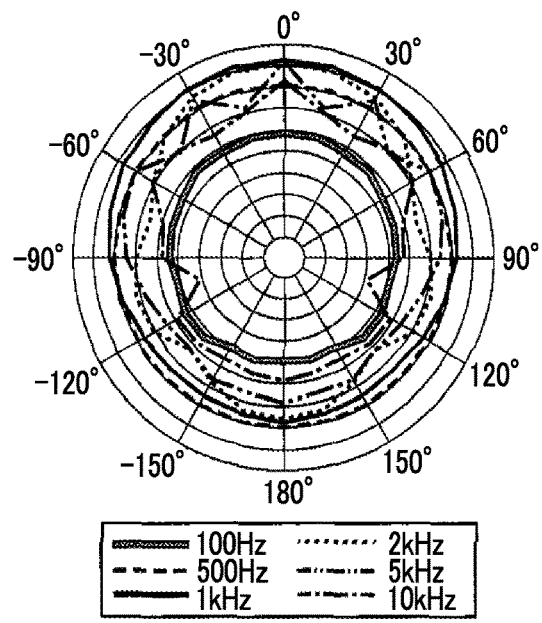
FIG. 11C is a graph showing the relationship between measurement directions and sound pressure levels.

In FIGS. 11A to 11C, a case of 100 Hz is indicated by a cross-hatched line, a case of 500 Hz is indicated by a broken line, a case of 1 kHz is indicated by a solid line, a case of 2 kHz is indicated by a dotted line, a case of 5 kHz is indicated by a two-dot chain line, and a case of 10 kHz is indicated by a one-dot chain line.

The electroacoustic transducer of the present invention is very thin and the area of the vibration plate (bent portion) can be made substantially the same as the size of the housing portion. Therefore, even in the case where the polyhedron is constituted by a plurality of the transduction units, the distance between the vibration plates is able to be reduced, and the junction between the transduction units is natural. Accordingly, as shown in FIGS. 11A and 11B, the sounds emitted from the respective transduction units vibrate almost in phase even when the sounds propagate in any direction.

Therefore, it can be seen that a uniform sound pressure level is able to be obtained in any direction, and the balance between the sound pressure levels in the low band, the intermediate band, and the high band is not changed, so that ideal omnidirectionality is obtained in the horizontal direction (the direction perpendicular to the long side).

In addition, in Comparative Example 1, as shown in FIG. 11C, it can be seen that the sound pressure level varies with angle at the positions other than the front surface, and the trend of the change varies with the frequency band, resulting in a change in the balance of frequencies with position and a change in tone.

Examples 3 and 4 and Comparative Example 2

Electroacoustic transducers were respectively prepared in the same manner as in Examples 1 and 2 and Comparative Example 1 except that the size of the bent portion was set to 200 mm×200 mm and the outer dimensions of the case were set to 240 mm×240 mm.

That is, the width of the edge portion of the pressing member is 20 mm.

[Evaluation]
<Frequency Properties>

The sound pressure level and frequency properties of the electroacoustic transducers of Examples 3 and 4 and Comparative Example 2 were measured in the same manner as the measurement of the frequency properties.

Figure 14:
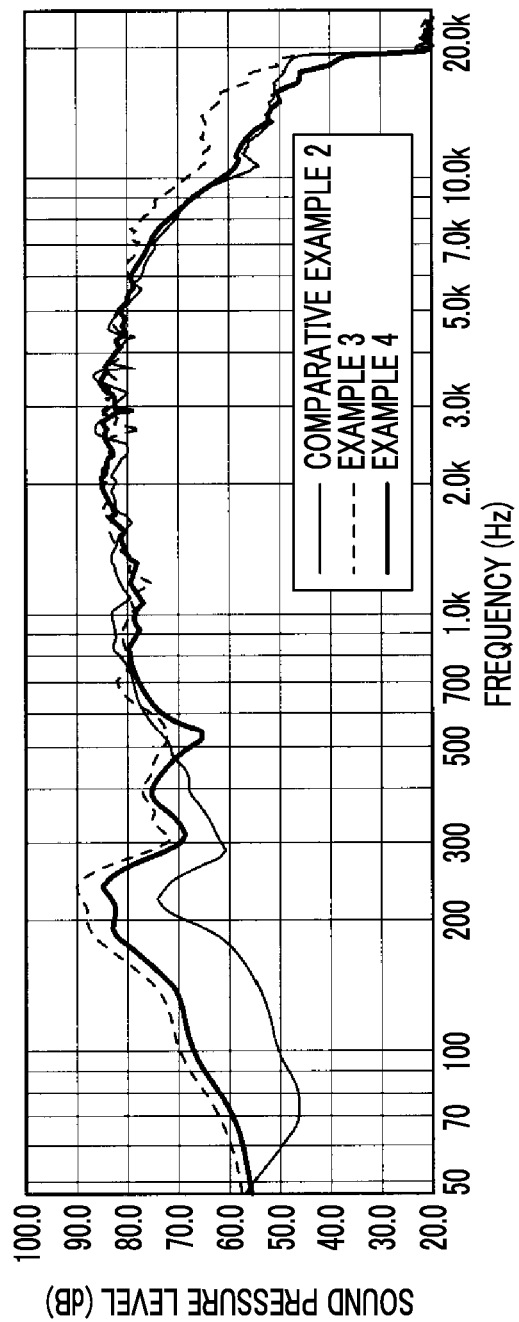
FIG. 14 is a graph showing the relationship between frequencies and sound pressure levels.

A graph of the comparison between the measurement results of the sound pressure level and frequency properties at the front surface is shown in FIG. 14.

Figure 15A:
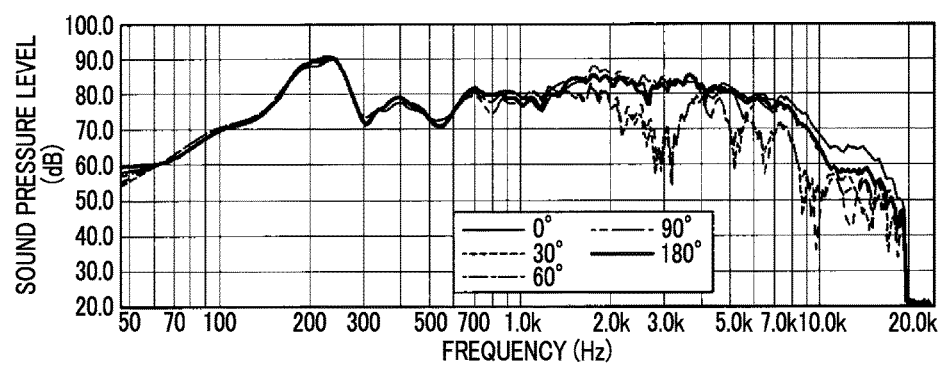
FIG. 15A is a graph showing the relationship between frequencies and sound pressure levels.
Figure 15B:
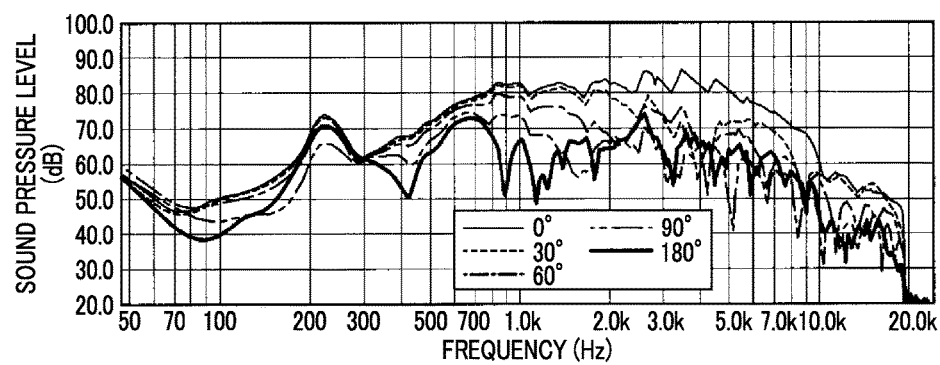
FIG. 15B is a graph showing the relationship between frequencies and sound pressure levels.

In addition, in Example 3 and Comparative Example 2, the results of measuring the sound pressure level and the frequency properties by changing the disposition (angle) of the microphone P are shown in FIGS. 15A and 15B.

As shown in FIGS. 14, 15A, and 15B, it can be seen from the comparison between Examples 3 and 4 and Comparative Example 2 that although the sound pressure levels are the same in an intermediate band, the sound pressure levels of Examples 3 and 4 are high in a low band and a wide band can be achieved.

Example 5

An electroacoustic transducer as illustrated in FIG. 3 was prepared in the same manner as in Example 3 except that the transduction unit in one face of a polyhedron was replaced with a cone speaker unit.

As the cone speaker unit, a speaker unit (diameter: 130 mm) was taken out from a subwoofer manufactured by Foster Electric Company, Limited.

[Evaluation]
<Frequency Properties>

The sound pressure level and frequency properties of the electroacoustic transducer of Example 5 in a case where the cone speaker unit was driven (subwoofer ON) and in a case where the cone speaker unit was not driven (subwoofer OFF) were measured in the same manner as the measurement of the frequency properties.

Figure 16:
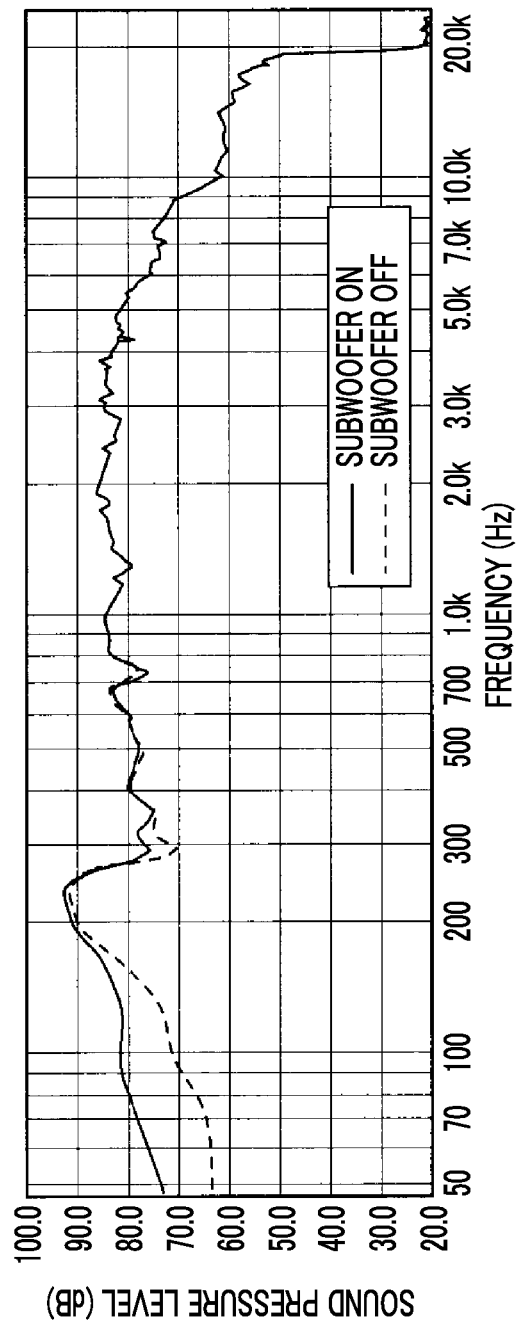
FIG. 16 is a graph showing the relationship between frequencies and sound pressure levels.

A graph of the comparison between the measurement results of the sound pressure level and frequency properties is shown in FIG. 16.

In addition, in the case of the subwoofer ON in Example 5, the results of measuring the sound pressure level by setting a certain speaker to the front surface (0°) and changing the disposition of the microphone P as described above are shown in FIG. 17.

It can be seen from FIG. 16 that in the case of the subwoofer ON, compared to the case of the subwoofer OFF, the sound pressure level in a low band is improved, and the sound pressure level in a wide band from the low band tends to be more uniform.

As described above, by disposing the cone speaker unit capable of reproducing a sound in a frequency band in which the sound pressure level of the electroacoustic transducer is low in some of the faces of the polyhedron, it is possible to make the sound pressure level in a wide frequency band more uniform.

Figure 17:
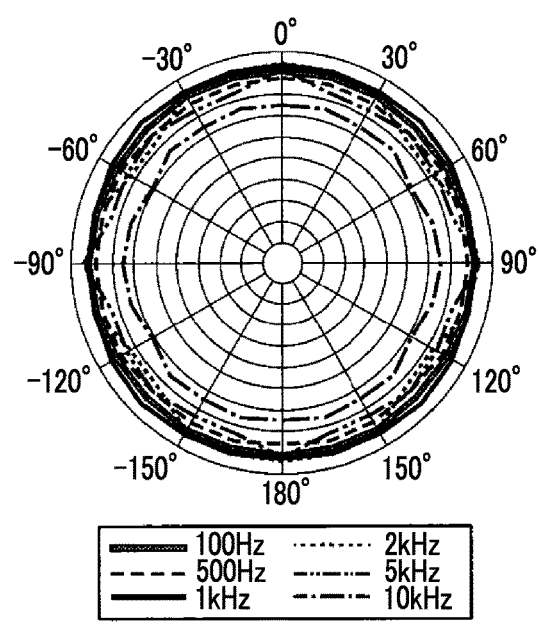
FIG. 17 is a graph showing the relationship between measurement directions and sound pressure levels.

Furthermore, by disposing the subwoofer (cone speaker unit) in some of the faces of the polyhedron, a subwoofer which effectively utilizes the internal cavity of the polyhedron as an enclosure can be realized. In addition, the respective transduction units and the subwoofer connect points to the center of the polyhedron, and this can be regarded as ideal point sound source reproduction. Accordingly, as shown in FIG. 17, it can be seen that a more uniform sound pressure level is able to be obtained in any direction, and the balance between the sound pressure levels in the low band, the intermediate band, and the high band is not changed, so that ideal omnidirectionality is obtained.

From the above results, the effects of the present invention are obvious.

EXPLANATION OF REFERENCES

10: electroacoustic transduction film
10a, 10c: sheet-like material
10b: laminated body
12: piezoelectric layer
14: lower thin film electrode
16: upper thin film electrode
18: lower protective layer 20: upper protective layer
24: viscoelastic matrix
26: piezoelectric body particles
30: corona electrode
32: direct-current power source
40: electroacoustic transduction unit
42: case
46: viscoelastic supporter
48: pressing member
48a: opening
100, 110, 120, 202: electroacoustic transducer
112: cone speaker unit
122: lid member

What is claimed is:

1. An electroacoustic transducer comprising:
two or more electroacoustic transduction units, each including an electroacoustic transduction film and an elastic supporter,
wherein, in each of the two or more electroacoustic transduction units:
the electroacoustic transduction film comprises a polymer composite piezoelectric body in which piezoelectric body particles are dispersed in a viscoelastic matrix formed of a polymer material having viscoelasticity at a normal temperature, and two thin film electrodes laminated on both surfaces of the polymer composite piezoelectric body,
the elastic supporter is disposed to be closely attached to one principal surface of the electroacoustic transduction film so as to cause the electroacoustic transduction film to be bent, and
a size of a bent portion of the electroacoustic transduction film with respect to a surface of the electroacoustic transduction unit on an electroacoustic transduction film side is more than or equal to 80%,
wherein the two or more electroacoustic transduction units are disposed so that all electroacoustic transduction films face outward and form some or all of faces of a polyhedron.

2. The electroacoustic transducer according to claim 1, wherein, in each of the two or more electroacoustic transduction units, the elastic supporter is a viscoelastic supporter having viscoelasticity.

3. The electroacoustic transducer according to claim 1, wherein, in each of the two or more electroacoustic transduction units, the bent portion of the electroacoustic transduction film gradually changes in curvature from a center to a peripheral portion.

4. The electroacoustic transducer according to claim 2, wherein, in each of the two or more electroacoustic transduction units, the bent portion of the electroacoustic transduction film gradually changes in curvature from a center to a peripheral portion.

5. The electroacoustic transducer according to claim 1, wherein the polyhedron is a regular polyhedron, a semi-regular polyhedron, or a quasiregular polyhedron.

6. The electroacoustic transducer according to claim 4, wherein the polyhedron is a regular polyhedron, a semi-regular polyhedron, or a quasiregular polyhedron.

7. The electroacoustic transducer according to claim 1, wherein, in each of the two or more electroacoustic transduction units, a shape of the bent portion of the electroacoustic transduction film, when viewed in a direction perpendicular to said principal surface of the electroacoustic transduction film, is a regular polygonal shape.

8. The electroacoustic transducer according to claim 6, wherein, in each of the two or more electroacoustic transduction units, a shape of the bent portion of the electroacoustic transduction film, when viewed in a direction perpendicular to said principal surface of the electroacoustic transduction film, is a regular polygonal shape.

9. The electroacoustic transducer according to claim 1, wherein cone speaker units are provided in some of the faces of the polyhedron with radiation surfaces facing outward.

10. The electroacoustic transducer according to claim 8, wherein cone speaker units are provided in some of the faces of the polyhedron with radiation surfaces facing outward.

11. The electroacoustic transducer according to claim 1, wherein, in each of the two or more electroacoustic transduction units, a storage elastic modulus (E') of the electroacoustic transduction film at a frequency of 1 Hz according to dynamic viscoelasticity measurement is 10 to 30 GPa at 0° C. and 1 to 10 GPa at 50° C.

12. The electroacoustic transducer according to claim 10, wherein, in each of the two or more electroacoustic transduction units, a storage elastic modulus (E') of the electroacoustic transduction film at a frequency of 1 Hz according to dynamic viscoelasticity measurement is 10 to 30 GPa at 0° C. and 1 to 10 GPa at 50° C.

13. The electroacoustic transducer according to claim 1, wherein, in each of the two or more electroacoustic transduction units, a glass transition temperature of the polymer material at a frequency of 1 Hz is 0° C. to 50° C.

14. The electroacoustic transducer according to claim 12, wherein, in each of the two or more electroacoustic transduction units, a glass transition temperature of the polymer material at a frequency of 1 Hz is 0° C. to 50° C.

15. The electroacoustic transducer according to claim 1, wherein, in each of the two or more electroacoustic transduction units, in the polymer material, a local maximum value at which a loss tangent Tan δ at a frequency of 1 Hz according to a dynamic viscoelasticity measurement is greater than or equal to 0.5 is present in a temperature range of 0° C. to 50° C.

16. The electroacoustic transducer according to claim 14, wherein, in each of the two or more electroacoustic transduction units, in the polymer material, a local maximum value at which a loss tangent Tan δ at a frequency of 1 Hz according to a dynamic viscoelasticity measurement is greater than or equal to 0.5 is present in a temperature range of 0° C. to 50° C.

17. The electroacoustic transducer according to claim 1, wherein, in each of the two or more electroacoustic transduction units, the polymer material has a cyanoethyl group.

18. The electroacoustic transducer according to claim 16, wherein, in each of the two or more electroacoustic transduction units, the polymer material has a cyanoethyl group.

19. The electroacoustic transducer according to claim 1, wherein, in each of the two or more electroacoustic transduction units, the polymer material is cyanoethylated polyvinyl alcohol.

20. The electroacoustic transducer according to claim 18, wherein, in each of the two or more electroacoustic transduction units, the polymer material is cyanoethylated polyvinyl alcohol.

21. The electroacoustic transducer according to claim 1, wherein, in each of the two or more electroacoustic transduction units, a shape of the surface of the electroacoustic transduction unit on the electroacoustic transduction film side and a shape of the bent portion of the electroacoustic transduction film, when viewed in a direction perpendicular to the principal surface of the electroacoustic transduction film, is a quadrilateral shape.

* * * * *